(12) United States Patent
Ding et al.

(10) Patent No.: US 8,744,012 B1
(45) Date of Patent: Jun. 3, 2014

(54) ON-CHIP EYE VIEWER ARCHITECTURE FOR HIGHSPEED TRANSCEIVERS

(75) Inventors: Weiqi Ding, Fremont, CA (US); Mingde Pan, Morgan Hill, CA (US); Sergey Shumarayev, Los Altos Hills, CA (US); Peng Li, Palo Alto, CA (US)

(73) Assignee: Altera Corporation, San Jose, CA (US)

( * ) Notice: Subject to any disclaimer, the term of this patent is extended or adjusted under 35 U.S.C. 154(b) by 142 days.

(21) Appl. No.: 13/369,108

(22) Filed: Feb. 8, 2012

(51) Int. Cl.
*H03K 9/00* (2006.01)

(52) U.S. Cl.
USPC .......................................... 375/316

(58) Field of Classification Search
USPC .................... 375/371, 228, 295, 317, 355
See application file for complete search history.

(56) References Cited

U.S. PATENT DOCUMENTS

| | | | |
|---|---|---|---|
| 4,881,243 A | 11/1989 | Whitt | |
| 6,973,407 B1 | 12/2005 | Abraham | |
| 6,995,553 B1 | 2/2006 | Nygaard | |
| 7,049,859 B2 | 5/2006 | Boyer et al. | |
| 8,074,126 B1 | 12/2011 | Qian et al. | |
| 8,081,723 B1 * | 12/2011 | Ding et al. | 375/355 |
| 8,111,784 B1 * | 2/2012 | Ding et al. | 375/317 |
| 8,433,958 B2 * | 4/2013 | Ding et al. | 714/704 |
| 8,451,883 B1 * | 5/2013 | Ding et al. | 375/228 |
| 2005/0226355 A1 | 10/2005 | Kibune et al. | |
| 2006/0020407 A1 | 1/2006 | Montijo et al. | |
| 2008/0133958 A1 * | 6/2008 | Cranford et al. | 713/600 |
| 2009/0154542 A1 | 6/2009 | Ding et al. | |
| 2009/0154591 A1 * | 6/2009 | Wong et al. | 375/295 |
| 2010/0202578 A1 * | 8/2010 | Tomita et al. | 375/371 |
| 2010/0329325 A1 | 12/2010 | Mobin et al. | |
| 2011/0228864 A1 | 9/2011 | Aryanfar et al. | |
| 2012/0072785 A1 * | 3/2012 | Ding et al. | 714/704 |

OTHER PUBLICATIONS

Machine English Translation of JP 2007-060655. Translation Dated Nov. 11, 2011.

* cited by examiner

*Primary Examiner* — Jaison Joseph
(74) *Attorney, Agent, or Firm* — Fletcher Yoder, P.C.

(57) ABSTRACT

System, methods, and devices for determining an eye diagram of a serial input signal to an integrated circuit without an oscilloscope are provided. For example, one embodiment of an integrated circuit device may be capable of determining an eye diagram associated with a serial input signal either during or after equalization. The device may include an equalizer and eye viewer circuitry configured to select a node of the equalizer for eye monitoring of the input signal, which may be during or after equalization. In one embodiment, the eye viewer circuitry may provide a separate sampler for each respective node, while sharing a control logic and phase interpolator among the samplers. The eye viewer circuitry may determine horizontal and vertical boundaries of the eye diagram associated with the serial input signal, as seen from the selected node of the equalizer.

29 Claims, 12 Drawing Sheets

ON-CHIP EYE VIEWER ARCHITECTURE FOR HIGHSPEED TRANSCEIVERS

BACKGROUND

Embodiments of the present invention relate generally high-speed serial data communication devices and, more specifically, to an eye viewer architecture that may be utilized for eye monitoring of high-speed serial signals.

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In high-speed serial interface (HSSI) applications, a high-speed serial input signal sent to a receiver (RX) portion of a transceiver of an integrated circuit (IC) device may become attenuated and distorted due to frequency-dependent signal loss across interconnects. For example, one form of distortion that may affect the input signal is intersymbol interference (ISI), which occurs when one data bit of the serial signal interferes with a subsequent data bit. Accordingly, increases in ISI rates may produce a measurable degradation of the input signal quality, which may negatively affect the margins of clock and data recovery (CDR) circuitry.

A variety of RX equalization and signal modeling techniques have been explored to improve the RX input signal before reaching clock and data recovery circuitry in the RX. For example, one technique for evaluating ISI in a high-speed serial input signal involves observing an eye diagram associated with the signal. An eye diagram may result when the waveform of each data bit of the signal is superimposed onto a single bit time interval, or unit interval (UI). Typically obtained by probing the high-speed serial input signal with an oscilloscope, an eye diagram is so named because the resulting superimposition of the bits of the high-speed serial signal forms the general shape of an open eye. A higher-quality serial signal generally has a more "open" eye diagram, while a lower-quality serial signal generally has a more "closed" eye diagram.

An eye diagram may enable designers or field engineers to visualize and correct for some ISI of a high-speed serial input signal, as well as other jitter compounds of the signal. However, an IC may generally include equalization circuitry to improve the quality of the signal, the output of which may be internal to sensitive high-speed nodes that may be difficult, if not impossible, to probe with an oscilloscope. Moreover, with or without equalization circuitry, any internal serial signals may become distorted by the RX circuitry or by on-die connections. As such, the ISI of the post-equalization signal or of other internal serial signals are typically difficult to visualize.

SUMMARY

Certain aspects of embodiments disclosed herein by way of example are summarized below. It should be understood that these aspects are presented merely to provide the reader with a brief summary of certain forms an invention disclosed and/or claimed herein might take and that these aspects are not intended to limit the scope of any invention disclosed and/or claimed herein. Indeed, any invention disclosed and/or claimed herein may encompass a variety of aspects that may not be set forth below.

Present embodiments relate to systems, methods, and devices for determining an eye diagram of a serial input signal to an integrated circuit without an oscilloscope. In particular, the present embodiments may enable determination of an eye diagram for such a serial input signal at various points during and/or after equalization, when it may be difficult or impossible to obtain a traditional eye diagram with an oscilloscope. For instance, present embodiments may be configured to provide eye monitoring of a signal at various intermediate nodes between multiple stages of a multi-stage equalizer with or without interrupting normal data traffic. Accordingly, an integrated circuit device may be capable of determining an eye diagram associated with an equalized or partially equalized serial input signal. In some embodiments, the integrated circuit device may also provide for eye monitoring of a serial signal provided by a transmitter of the integrated circuit. Such devices may include an equalizer and eye viewer circuitry. The equalizer may receive and perform equalization on a serial input signal to produce the equalized serial input signal, and the eye viewer circuitry may determine horizontal and vertical boundaries of the eye diagram associated with the equalized serial input signal, as well as with the input signal at one or more intermediate stages of the equalizer.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present invention alone or in any combination. Again, the brief summary presented above is intended only to familiarize the reader with certain aspects and contexts of embodiments of the present disclosure without limitation to the claimed subject matter.

BRIEF DESCRIPTION OF THE DRAWINGS

These and other features, aspects, and advantages of the present disclosure will become better understood when the following detailed description of certain exemplary embodiments is read with reference to the accompanying drawings in which like characters represent like parts throughout the drawings, wherein.

DETAILED DESCRIPTION OF SPECIFIC EMBODIMENTS

One or more specific embodiments of the present invention will be described below. These described embodiments are only exemplary of the present invention. Additionally, in an effort to provide a concise description of these exemplary embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Embodiments of the present disclosure relate to circuitry for generating eye diagrams of high-speed serial signals to an integrated circuit (IC) that are propagated via circuitry internal to the IC, such as serial signals that have passed through one or more stages of an equalizer. In particular, ICs that may receive high-speed serial input signals (e.g., between approximately 6 Gbps to 28 Gbps or higher) may have signal paths too sensitive for oscilloscope probes to test the signals after or during equalization. Using the eye viewer circuitry described below, a designer or field engineer may obtain an eye diagram of a high-speed serial input signal after the signal has passed one or more stages of equalizer circuitry or is propagating through other sensitive locations on an integrated circuit. By observing the eye diagram of the signal of interest, the designer or field engineer may adjust the parameters of the equalizer to improve the signal quality or may diagnose the receiver path.

The eye viewer circuitry may determine not only horizontal boundaries of the eye diagram associated with the equalized signal, but also vertical boundaries. Based on the determined horizontal and vertical boundaries, a two-dimensional (2-D) visualization of the eye diagram may be constructed. Moreover, the eye viewer circuitry may also indicate an error rate (e.g., a bit error rate (BER) or a cyclic redundancy check (CRC) error rate) at various points within the horizontal and vertical boundaries. The error rates may be used to construct a three-dimensional (3-D) visualization of the eye diagram, in which the error rates at the various points throughout the eye diagram are represented as third-dimension distances and/or colors.

Figure 1:
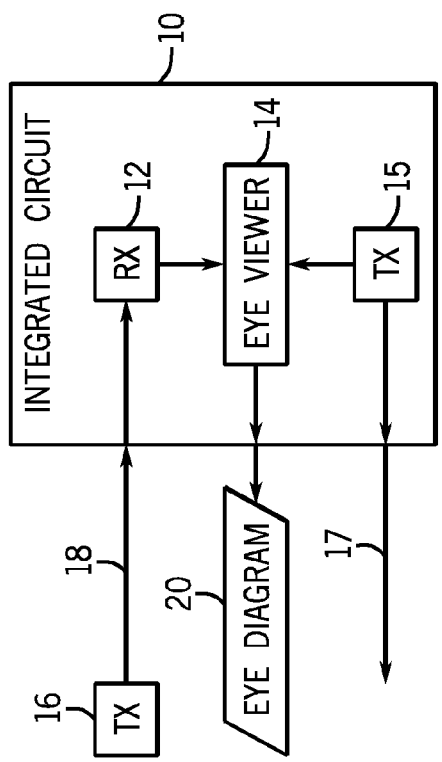
FIG. 1 is a block diagram of an integrated circuit that includes circuitry configured to generate an eye diagram of a high-speed serial input signal during and/or after equalization, in accordance with one embodiment.

With the foregoing in mind, FIG. 1 illustrates a block diagram of an integrated circuit (IC) 10 having a receiver (RX) 12, eye viewer circuitry 14, and a transmitter (TX) 15. The IC 10 may be any type of integrated circuit having the RX 12, TX, 15, and eye viewer circuitry 14, and may be, for example, a programmable logic device (PLD) from the Stratix® family of field-programmable gate array (FPGA) devices, available from Altera Corporation of San Jose, Calif. Commonly, the RX 12 and the TX 15 of the integrated circuit 10 may be referred to collectively as a transceiver. As shown, an external transmitter (TX) 16 (e.g., part of another IC device) may provide a high-speed serial input signal 18 to the RX 12 of the IC 10.

For debugging and/or equalizer optimization/improvement purposes, an eye diagram 20 of the input signal 18 may be generated (using the eye viewer circuitry 14) after equalization, or at one or more intermediate nodes within the equalization circuitry of the RX 12. As discussed in further detail below, at certain speeds, such as between approximately 6 to 12 Gbps, monitoring an eye diagram 20 of the signal 18 after equalization may be sufficient for debugging and/or optimization purposes. However data rates continue to increase, such as to approximately 28 Gbps or higher, the input signal 18 may become more susceptible to noise and/or cross-talk and may also exhibit smaller signal amplitudes at internal nodes due to attenuation. As such, embodiments discussed below may also provide flexibility to monitor the input signal 18 (via eye diagrams 20) at multiple nodes within the equalization circuitry of the RX 12.

Accordingly, depending on a selected node of interest, the eye viewer circuitry 14 may output eye diagram data 20. Additionally or alternatively, the RX input signal 18 or any other serial signal internal to the IC 10 may enter the eye viewer circuitry 14, which may output eye diagram data 20 particular to the serial signal. For instance, in one embodiment, the eye viewer circuitry 14 may also be configured receive a serialized signal 17 from the TX 15 of the integrated circuit, from which a corresponding eye diagram may be generated for debugging and/or optimization purposes. As can be appreciated, the eye diagram data 20 may represent information sufficient for construction of a two-dimensional (2-D) or three-dimensional (3-D) eye diagram associated with the particular serial signal.

Figure 2:
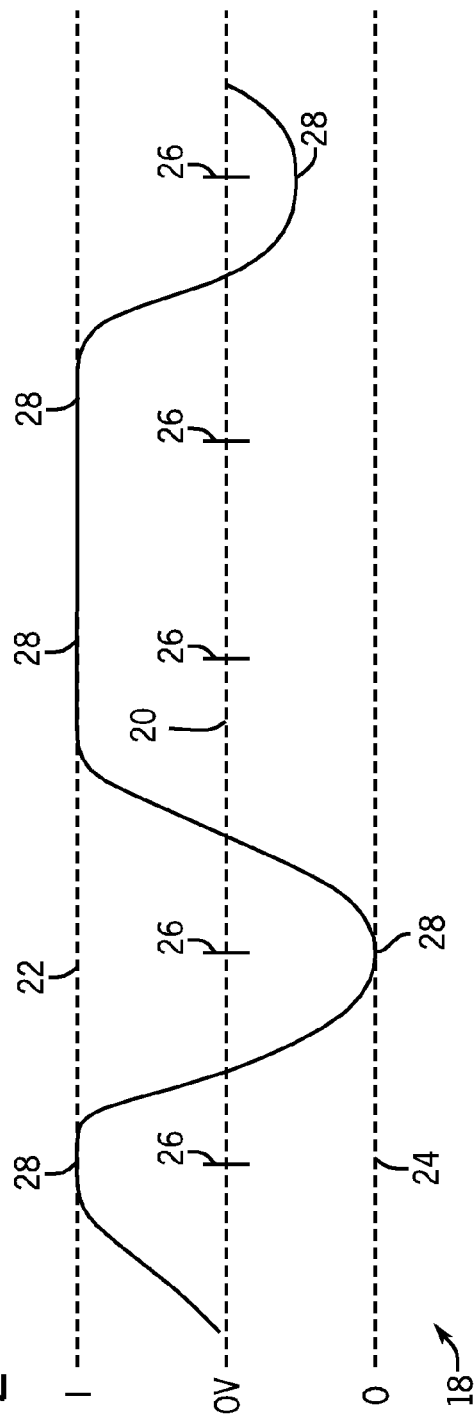
FIG. 2 depicts a high-speed serial input signal that may be received by the integrated circuit of FIG. 1, in accordance with one embodiment.

With these points in mind, one example of an RX input signal 18 is provided in FIG. 2. The RX input signal 18 may be a single high-speed serial signal, which may or may not be transmitted with a separate clock signal. Centered around approximately 0V, as indicated by numeral 20, a voltage level greater than 0V may be considered a binary 1, while a voltage lower then 0V may be considered a binary 0, as respectively indicated by numerals 22 and 24, or vice-versa. At a regular clock interval, indicated by numeral 26, each bit 28 of the signal may be determined based on its relationship to 0V.

As shown in FIG. 2, the RX input signal 18 may not always precisely reach a maximum high and maximum low upon entering the RX 12 of the integrated circuit 10. Indeed, in certain situations, intersymbol interference (ISI) may occur. For example, due to frequency dependencies and bandwidth limitations of the backplane through which the RX input signal 18 may travel, certain bits 28 may fail to reach the maximum or minimum voltage at a given clock interval 26. One such example is illustrated by the final low bit 28 of the RX input signal 18 of FIG. 2, which follows two sequential high bits 28. If the RX input signal 18 exhibits excessive ISI, data errors may result. Because the RX input signal 18 will pass through equalization (EQ) circuitry in the RX 12, and adjustments to the EQ circuitry may reduce ISI, the eye viewer circuitry 14 may be utilized to generate an eye diagram 20 of the RX input signal 18 while the signal 18 is passing through and/or after the signal 18 has passed through the EQ circuitry.

Figure 3:
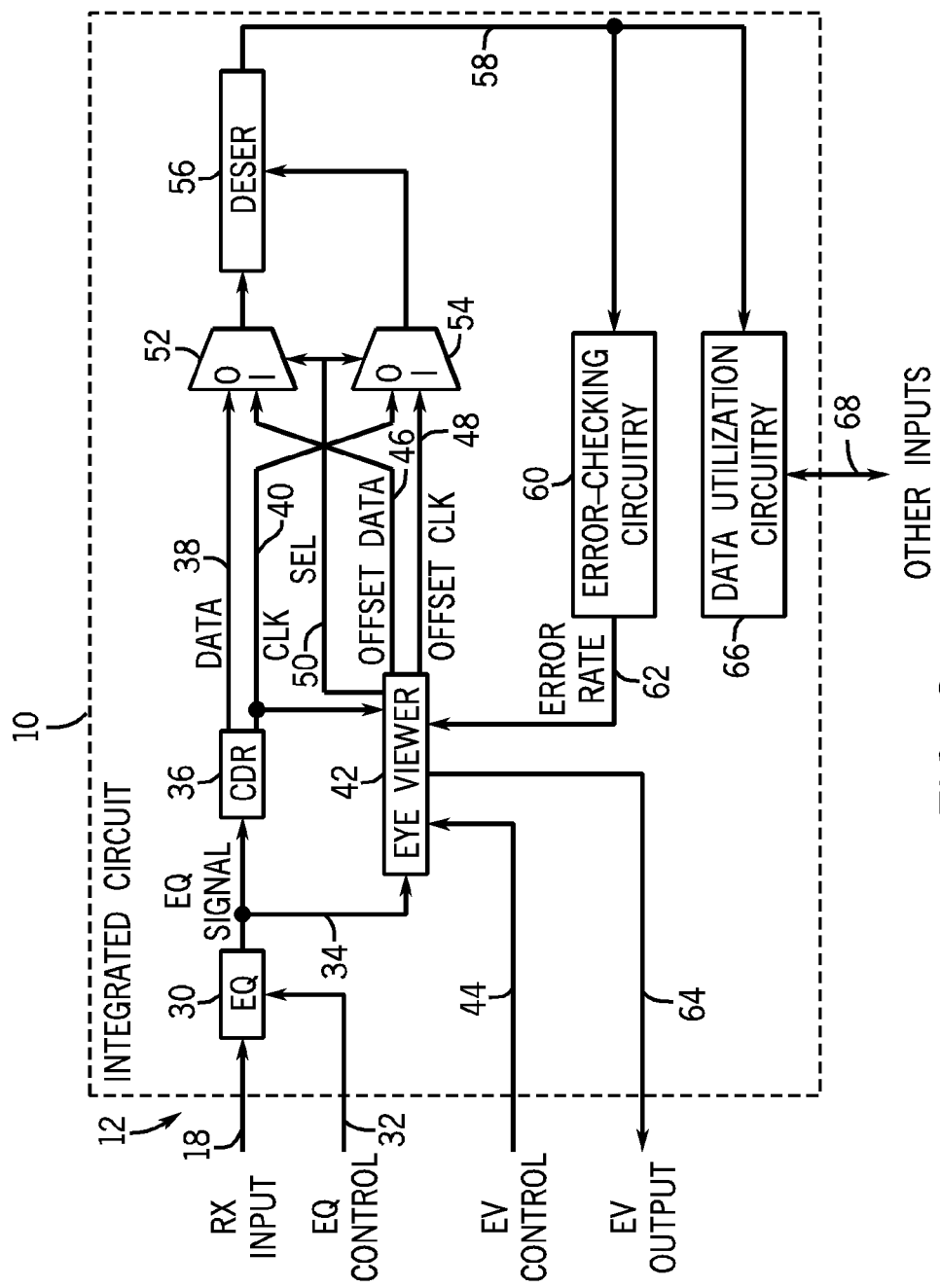
FIG. 3 is a block diagram illustrating an embodiment of the integrated circuit of FIG. 1 that includes eye viewer circuitry configured to provide for eye monitoring of a signal after equalization.

FIG. 3 is a block diagram of the integrated circuit (IC) 10, in accordance with one embodiment. Specifically, FIG. 3 depicts an embodiment of the IC 10 that is configured to provide for eye monitoring of the input signal 18 after equalization, which, as discussed above, may be sufficient for debugging and/or optimizing the equalizer and/or other components of the IC 10 in applications where the data rate of the input signal is between approximately 6 to 12 Gbps. Embodiments of an IC 10 that may additionally provide eye viewer circuitry configured to provide monitoring at multiple intermediate nodes between equalizer stages, which may be suitable for debugging and/or optimizing ICs having higher data rates (e.g., 28 Gbps or higher), will be discussed further below in FIGS. 9-10.

As shown in FIG. 3, when the receiver (RX) input signal 18 enters the receiver (RX) 12 of the IC 10, the RX input signal 18 may pass through an equalizer (EQ) 30. The EQ 30 may adjust the gain or bandwidth of the RX input signal 18, which may improve the signal quality. In certain embodiments, an equalization (EQ) control signal 32 may enable modification of the equalization procedures of the EQ 30 by changing programmable or reprogrammable components of the IC 10 pertaining to the operation of the EQ 30. When the RX input signal 18 has passed through the EQ 30, an equalized (EQ) signal 34 may result. Although the EQ 30 may have multiple intermediate stages or may be a single-stage equalizer, the presently illustrated embodiment of FIG. 3 depicts a configuration in which eye monitoring is available only after equalization of the signal 18 (e.g., to produce EQ signal 34).

The EQ signal 34 may then enter clock and data recovery (CDR) circuitry 36, which may obtain from the EQ signal 34 a recovered data signal and recovered clock signal, indicated here by reference numbers 38 and 40, respectively. When the IC 10 is operating in an eye viewer mode, eye viewer circuitry 42 may analyze the EQ signal 34 to obtain an eye diagram. The eye viewer circuitry 42 may receive the EQ signal 34 and the recovered clock signal 40 as inputs, and may output an offset data signal 48 and an offset clock signal 46, which may represent data sampled from certain points in the eye of the EQ signal 34. For this reason, as described in greater detail below, the offset data signal 48 and the offset clock signal 46 may be used in determining an eye diagram associated with the EQ signal 34.

Eye viewer (EV) control signals 44 may activate and provide certain parameters for the operation of the eye viewer circuitry 42. For example, the EV control signals 44 may cause the eye viewer circuitry 42 to enable a transition from a normal mode of operation to an eye viewer mode of operation. To do so, the eye viewer circuitry 42 may output a selection signal 50, which may cause a multiplexer 54 to output the offset clock signal 48 produced by the eye viewer circuitry 42 instead of the recovered clock signal 40 from the CDR 36. Similarly, the selection signal 50 may cause another multiplexer 52 to output the offset data signal 46 from the eye viewer circuitry 42 instead of the recovered data signal 38 from the CDR 36. Accordingly, a deserializer 56 may use these signals 46 and 48 to produce a parallel data signal 58. Further, error checking circuitry 60 may detect errors in the parallel data signal 58 and output an error rate 62, which may represent a bit error rate (BER) and/or a cyclic redundancy check (CRC) error rate.

In general, if the parallel data signal 58 represents data sampled from the center of the eye of the EQ signal 34, the error rate signal 62 may be relatively low (e.g., a BER approaching approximately $10^{-12}$ or less). However, when the offset data signal 46 and the offset clock signal 48 approach the boundaries of the eye of the EQ signal 34, the error rate signal 62 may be relatively high (e.g., a BER approaching approximately $10^{-6}$ or greater). Thus, the eye viewer circuitry 42 may be configured to determine the boundaries of the eye of the EQ signal 34 based at least partially upon whether the error rate signal 62 indicates an error rate that exceeds a maximum acceptable threshold (e.g., a BER of approximately $10^{-6}$ or $10^{-12}$). From such determinations, the eye viewer circuitry 42 may output an eye viewer (EV) output signal 64, which may represent data sufficient to construct an eye diagram associated with the EQ signal 34. As can be appreciated, the data represented by the signal 64 may be used to generate a visual eye diagram that may be displayed using a display device.

As further shown in FIG. 3, the IC 10 may also include other elements, represented in FIG. 3 as data utilization circuitry 66. The data utilization circuitry 66 may represent, for example, field programmable gate array (FPGA) programmable or reprogrammable elements. Other inputs 68 may enable external communication with the data utilization circuitry 66. Additionally, if the IC 10 is not operating in eye viewer mode, but rather in what may be referred to as a "normal mode" or "normal data recovery mode," then it is the recovered data signal 38 and recovered clock signal 40 that are instead passed by the multiplexers 52 and 54 to the deserializer 56, which produces the deserialized signal 58 that may be provided to the data utilization circuitry 66. However, as can be appreciated, when eye viewer mode is selected (e.g., via the EV control signal 44), normal data traffic (represented by recovered data signal 38 and recovered clock signal 40) would be interrupted, as the state of the selection signal 50 during eye viewer mode causes the multiplexers 52 and 54 to pass the offset clock 46 and offset data 50 signals instead of the recovered clock 40 and recovered data 38 signals to the deserializer 56. This is discussed in more detail below.

Figure 4:
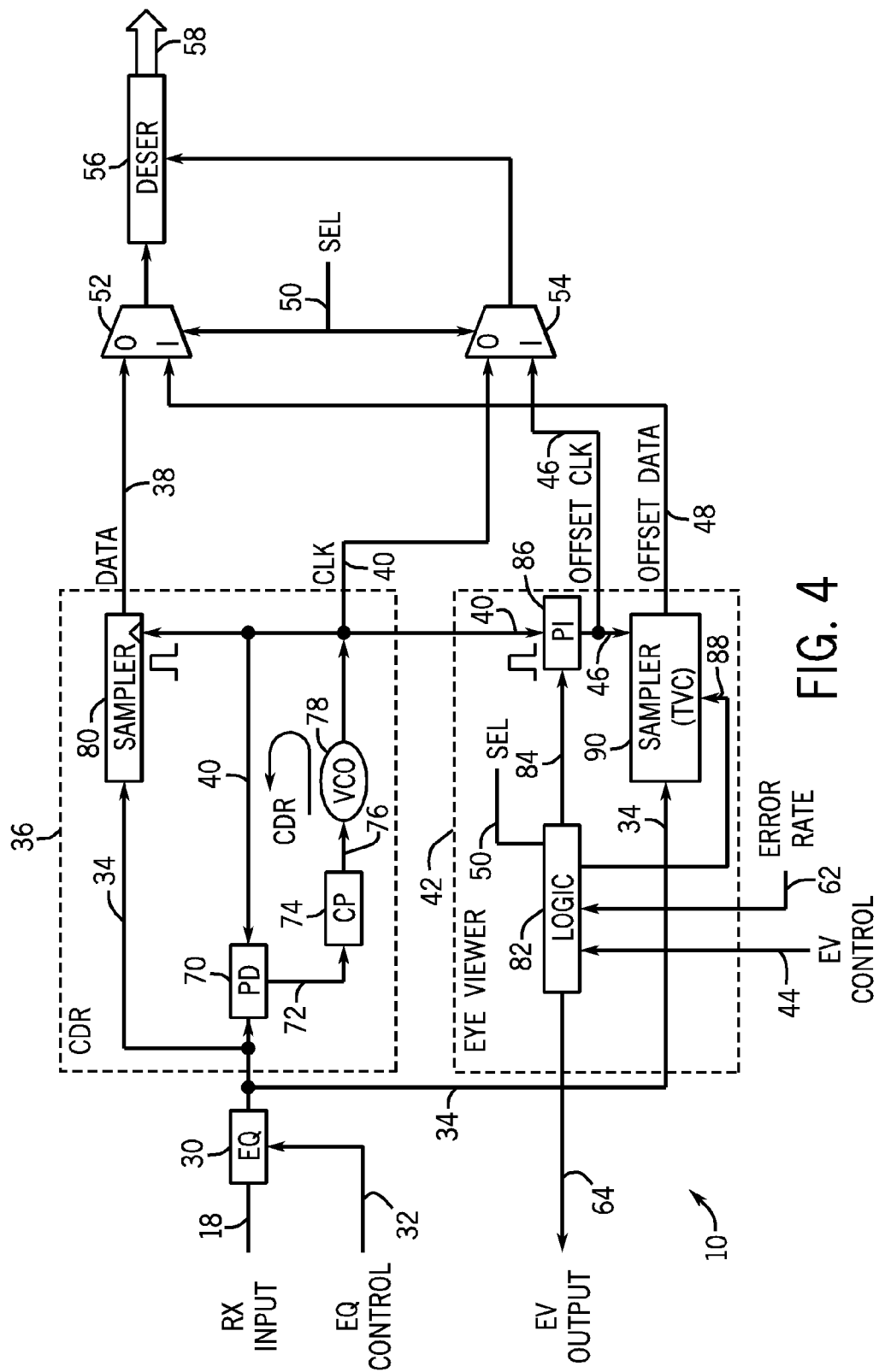
FIG. 4 is a block diagram illustrating eye viewer circuitry of FIG. 3 in further detail, in accordance with one embodiment.

With these points in mind, FIG. 4 is a block diagram that provides a description of the clock and data recovery (CDR) circuitry 36 and the eye viewer circuitry 42 in greater detail. As illustrated in FIG. 4, after the receiver (RX) input signal 18 has been equalized in the equalizer (EQ) 30, the resulting equalized (EQ) signal 34 may enter the CDR circuitry 36. To recover the clock signal 40 associated with the EQ signal 34, a phase detector (PD) 70 may first compare the phase of the EQ signal 34 to that of a feedback clock signal, such as the recovered clock signal 40. A phase error signal 72 output by the PD 70 may enter charge pump (CP) circuitry 74. Based on the phase error signal 72, the CP circuitry 74 may output a control signal 76 that causes a voltage-controlled oscillator (VCO) 78 to either increase (advance) or decrease (retard) the output clock signal 40.

To recover the data signal 38 from the EQ signal 34, a sampler 80 may sample the EQ signal 34 on the recovered clock signal 40. The resulting recovered data signal 38 represents a re-timed serial data signal that more precisely matches the recovered clock signal 40. Additionally or alternatively, the CDR circuitry 36 may only partially deserialize the EQ signal 34. For such an embodiment, instead of producing the single serial data signal 38, the output of the sampler 80 may alternatively be two, four, or more signals, each of which may include a respective portion of incoming serial data. However, in the interest of simplicity, it may be understood that the output of the sampler 80 is only a single retimed serial signal.

Under normal operation mode, as discussed briefly above, the selection signal 50 is set to 0, such that the multiplexers 52 and 54 will pass the recovered data signal 38 and the recovered clock signal 40 to the deserializer 56. The deserializer 56 may output a parallel data signal 58 that consists of the recovered data from the CDR circuitry 36. When desired, a user may initiate an eye viewer mode via the eye viewer (EV) control signals 44, which may be received by eye viewer control logic 82 of the eye viewer circuitry 42. Thus, in eye viewer mode, the control logic 82 may set the selection signal 50 to 1, causing the multiplexers 52 and 54 to pass not the normal recovered data signal 38 and recovered clock signal 40, but rather the offset data signal 48 and the offset clock signal 46 to the deserializer 56. As discussed in more detail below, for embodiments of the IC 10 configured to provide for eye monitoring at multiple intermediate nodes of the equalizer, such as for ICs supporting higher data rates (e.g., 28 Gbps or higher), the control logic 82 may be shared between multiple samplers of the eye viewer circuitry 42. This not only saves circuit real estate, but also reduces the number of components in the IC, which may result in reduced power consumption as well.

In general, the CDR circuitry 36 may always remain active, regardless of whether the IC 10 is operating in a normal data recovery mode or in the eye viewer mode. However, the eye viewer circuitry 42 may generally only be active when the EV control signal 44 provides a control signal to eye viewer control logic 82 that causes the eye viewer circuitry 42 to become active. In one embodiment, the control logic 82 may be configured to operate as a state machine that performs an algorithm, which generally may be described below with reference to FIGS. 7 and 8.

Referring still to FIG. 4, when the IC 10 operates in the eye viewer mode, the control logic 82 may send a control signal 84 to a phase interpolator (PI) 86 and a control signal 88 to a sampler 90, which may be configured to operate as a threshold-variable comparator (TVC). The PI 86 may receive the recovered clock signal 40 from the CDR circuitry 36 and, based on the control signal 84, may generate the offset clock signal 46 by altering the phase of the clock signal 40. The TVC 90 may receive and sample the EQ signal 34 on the offset clock signal 46 and output the offset data signal 48. Particularly, the TVC 90, in one embodiment, may output a binary 1 if the EQ signal 34 exceeds the threshold voltage Vt (represented by signal 88) on the offset clock signal 46 and may output a binary 0 if the EQ signal 34 is beneath the threshold voltage Vt on the offset clock signal 46. That is, the voltage Vt essentially acts as a reference voltage that the TVC 90 uses as a basis for comparison with the EQ signal 34. In one embodiment, the control logic 82 may include a digital to analog converter (DAC) configured to generate the reference voltage 88. Accordingly, "reference" and "threshold" may be used generally interchangeable when describing the voltage 88 provided to the sampler 90.

Thus, in this manner, varying the offset clock signal 46 to represent a different phase offset of the recovered clock 40 may cause the TVC 90 to sample different horizontal portions of the eye of the EQ signal 34, while varying the threshold voltage Vt indicated by the control signal 88 may cause the TVC 90 to sample different vertical portions of the eye of the EQ signal 34. In other words, by varying the offset clock signal 46 via the control signal 84 and the threshold voltage Vt via the control signal 88, the control logic 82 may cause the TVC 90 to output data recovered from any location within the eye of the EQ signal 34. The operation of the TVC 90 with respect to the eye of the EQ signal 34 may be described in greater detail below with reference to FIG. 5. By way of example only, one embodiment of the TVC sampler 90 may be of a type disclosed in U.S. patent application Ser. No. 12/722,319, filed on Mar. 11, 2010 and entitled "High-Speed Differential Comparator Circuitry With Accurately Adjustable Threshold," the entirety of which is incorporated by reference for all purposes.

Figure 5:
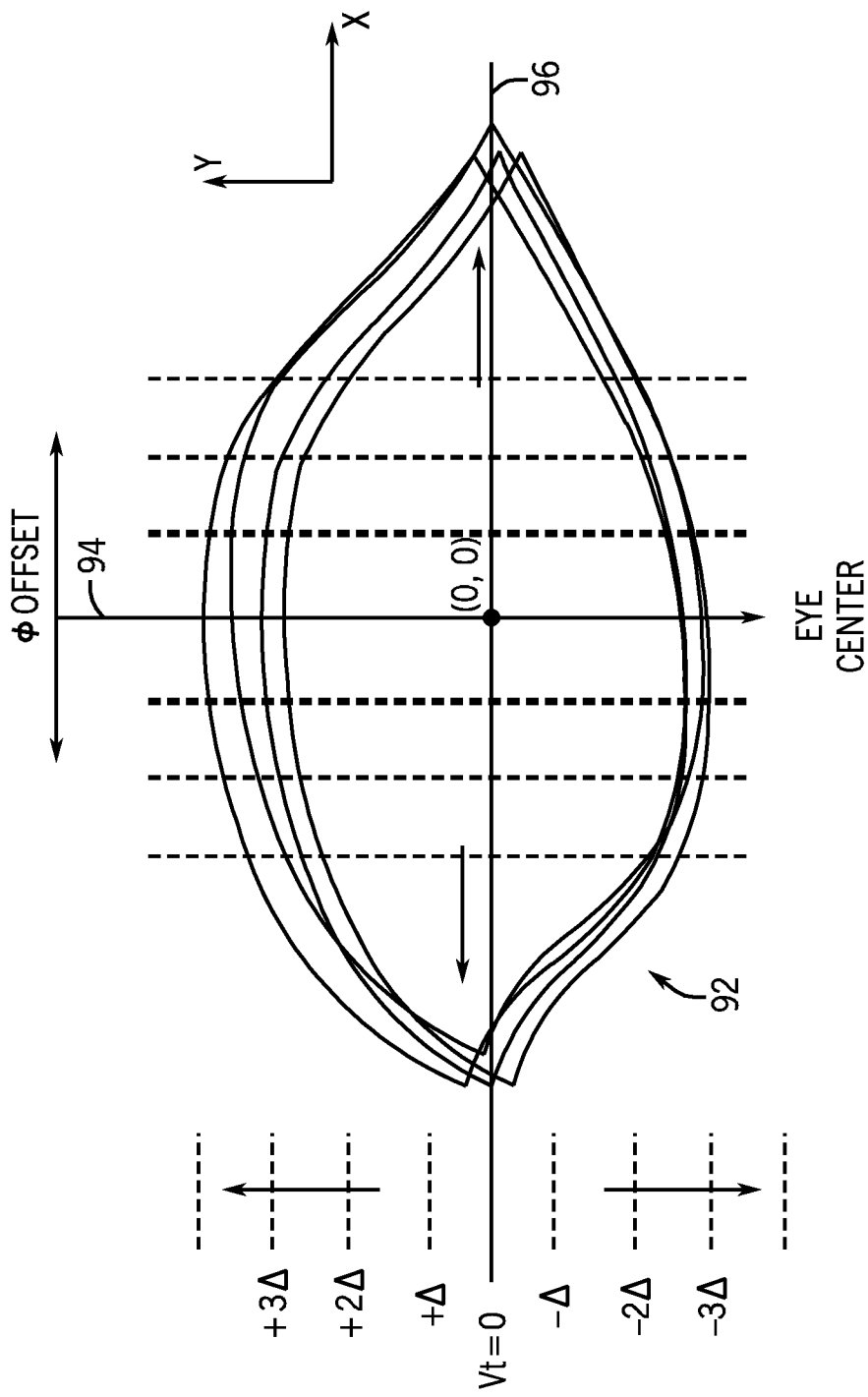
FIG. 5 is a schematic diagram representing a manner of controlling the circuitry of FIG. 4 to determine an eye diagram, in accordance with embodiments of the present disclosure.

FIG. 5 illustrates a schematic diagram of an eye 92 of the equalized (EQ) signal 34. The eye 92 of FIG. 5 represents the outer boundaries of the recoverable EQ signal 34, as might be apparent if the EQ signal 34 could be probed using an oscilloscope. In lieu of determining the shape of the eye 92 of the EQ signal 34 using an oscilloscope, which may be difficult or impossible for modern integrated circuits with very small components, the eye viewer circuitry 42 may determine the shape of the eye 92 by testing the signal quality of the EQ signal 34 at various points within the eye 92. In particular, the outer boundaries of the eye 92 may represent the quantity of phase offset from the clock signal 40 (reflected in the offset clock signal 46) and/or the threshold voltage Vt (reflected in the control signal 88) that, when applied to the threshold-variable comparator (TVC) 90 currently sampling the EQ signal 34, result in a recovered offset data signal 48 with less than a threshold error rate (reflected in the error rate signal 62).

To determine the shape of the eye 92 by testing the EQ signal 34 signal quality at various points within the eye 92, the control logic 82 may cause the TVC 90 to receive the offset clock signal 46 and the reference voltage 88 in various combinations. The resulting recovered offset data signal 48 output by the TVC 90 may be tested for errors using the error checking circuitry 60. Specifically, varying the phase offset of the recovered clock signal 40 may enable the TVC 90 to sample the EQ signal 34 at different horizontal locations within the eye 92, while varying the reference voltage 88 may enable the TVC 90 to sample the EQ signal 34 at different vertical locations within the eye 92. The center of the eye 92 may occur at a clock center 94, which may generally represent the unmodified clock signal 40, and at a baseline threshold voltage Vt 96, which may generally occur at 0V. As such, the center of the eye 92 is reflected in FIG. 5 at (x, y) coordinates of (0,0), in which the x-direction represents steps in the phase offset from the clock signal 40 and the y-direction represents steps in the threshold voltage Vt. Each integer increase in the (x, y) coordinates may represent one discrete increase or decrease in the phase offset amount or the threshold voltage Vt, respectively. The size of these discrete steps may be preprogrammed in the control logic 82 or may be provided to the control logic 82 by an external device via the EV control signals 44. As can be appreciated, the greater the granularity of the discrete steps for the phase offsets and the voltage Vt, the higher the resolution of a resulting eye diagram of the eye 92.

The control logic 82 of the eye viewer circuitry 42 may cause the TVC 90 to sample the eye 92 of the EQ signal 34 at such discrete horizontal and vertical steps, observing the resulting error rate signal 62 for the output offset data 48, until all boundaries of the eye 92 have been determined. One such algorithm for determining such boundaries is described below with reference to FIGS. 7 and 8. The control logic 82 may output the (x, y) coordinates of the determined boundaries of the eye 92 in the EV output signals 64, from which an external device may construct a corresponding two-dimensional (2-D) eye diagram, such as the eye diagram illustrated in FIG. 6. Since the boundaries of such a 2-D eye diagram depend upon the error rates, different error rates will generally give different 2-D eye diagrams. Additionally or alternatively, the control logic 82 may output the (x, y) coordinates as each of the locations in the eye 92 are tested for errors in the EV output signals 64. In such embodiments, an external device may receive both the (x, y) coordinates and the corresponding test error rates associated with the (x, y) coordinates to construct a three-dimensional (3-D) eye diagram. Such a 3-D eye diagram, which may include the eye diagram illustrated in FIG. 9, may represent not only the vertical and horizontal boundaries of the eye 92, but also the tested error rates at each (x, y) coordinate of the eye 92.

Figure 6:
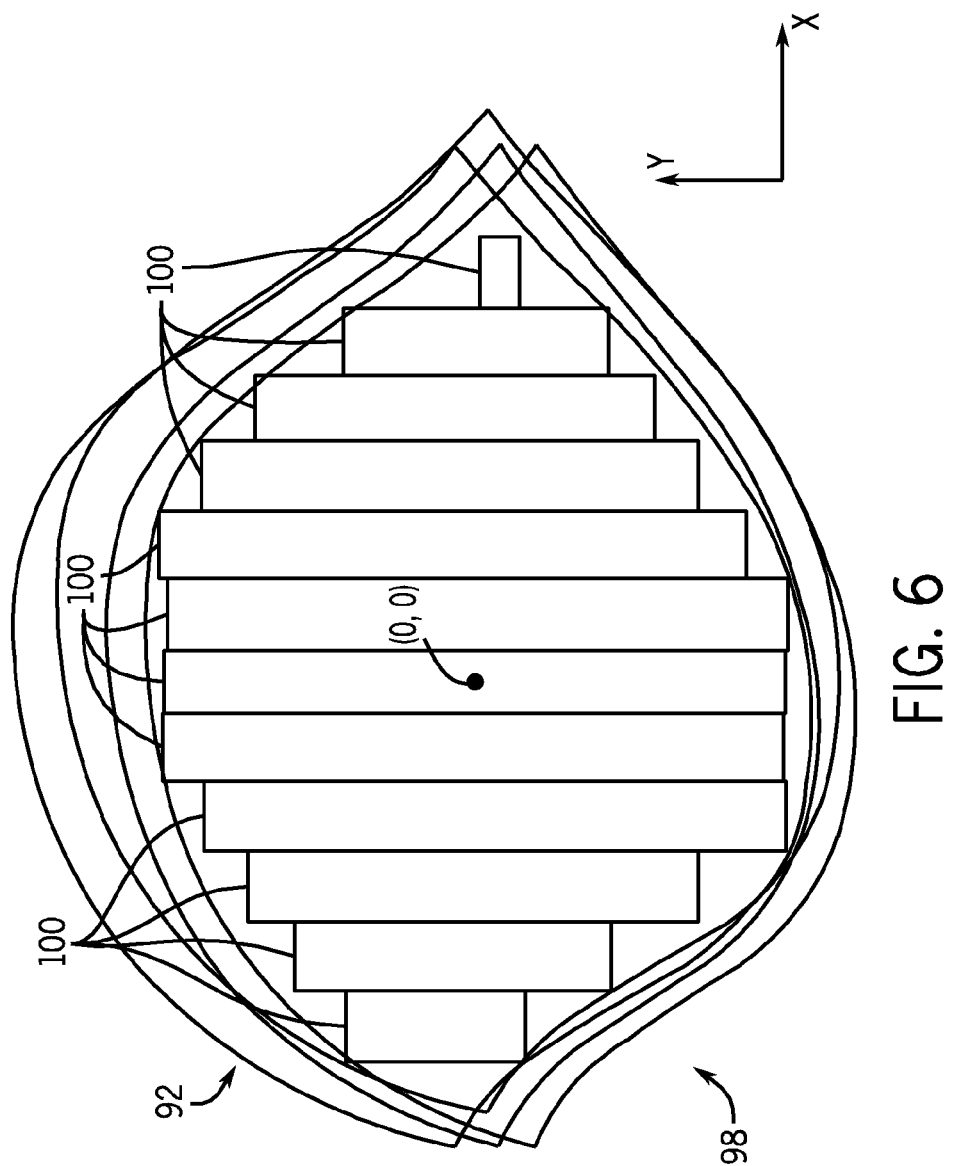
FIG. 6 is a schematic diagram showing a two-dimensional (2-D) eye diagram that may be determining using the circuitry of FIG. 4, in accordance with one embodiment.

Referring now to FIG. 6, an example of a two-dimensional (2-D) eye diagram 98 that may be constructed by an external device based on EV output signals 64 provided by the eye viewer circuitry 42 is illustrated in accordance with aspects of the present disclosure. In the eye diagram 98, the upper and lower bounds of the threshold voltage Vt for each discrete phase offset position are represented by columns 100. Each of the columns 100 is aligned with a different discrete phase offset position, from a leftward horizontal boundary position to a rightward horizontal boundary.

Figure 7:
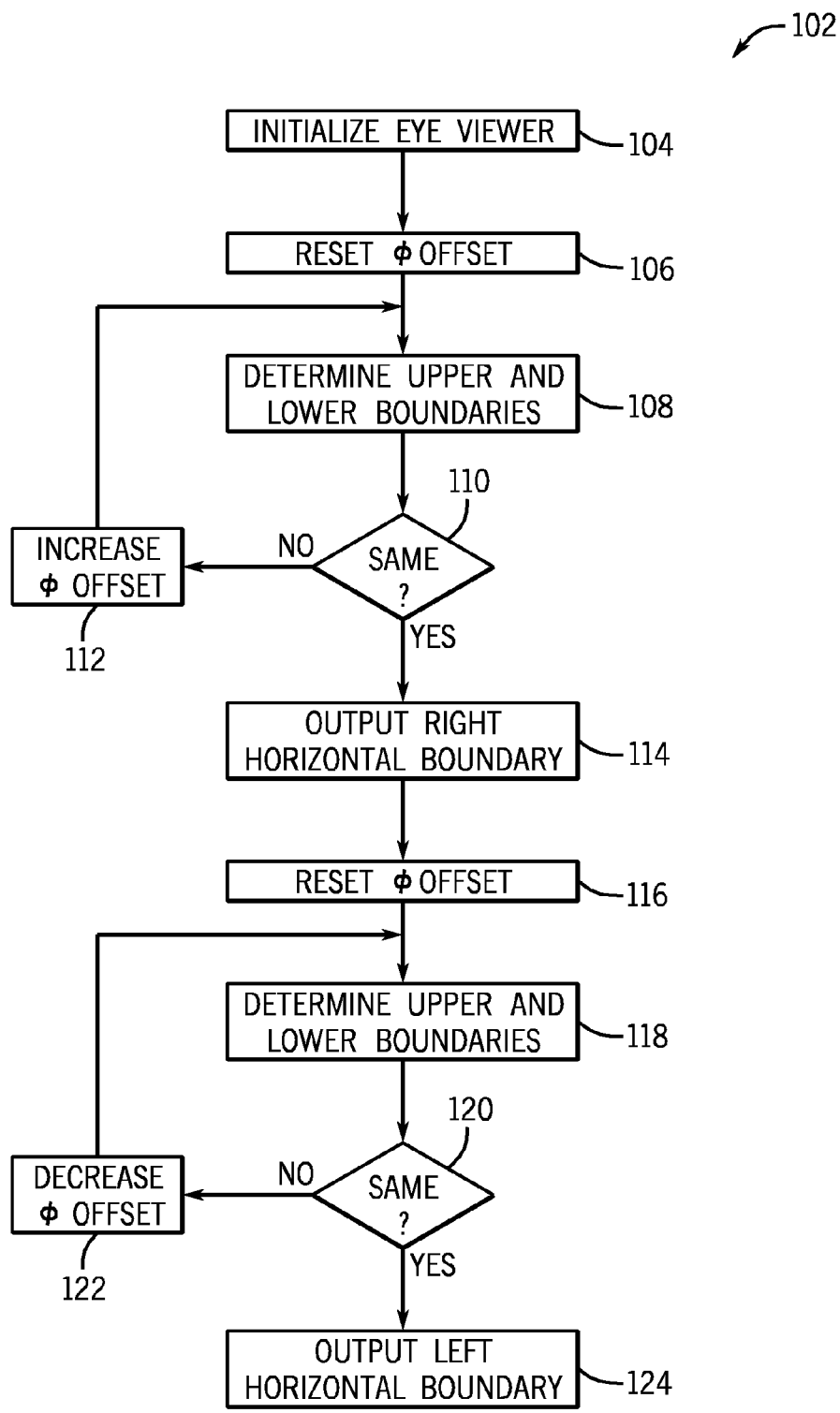
FIGS. 7 and 8 are flowcharts that describe a method for determining the eye diagram shown in FIG. 6, in accordance with one embodiment.
Figure 8:
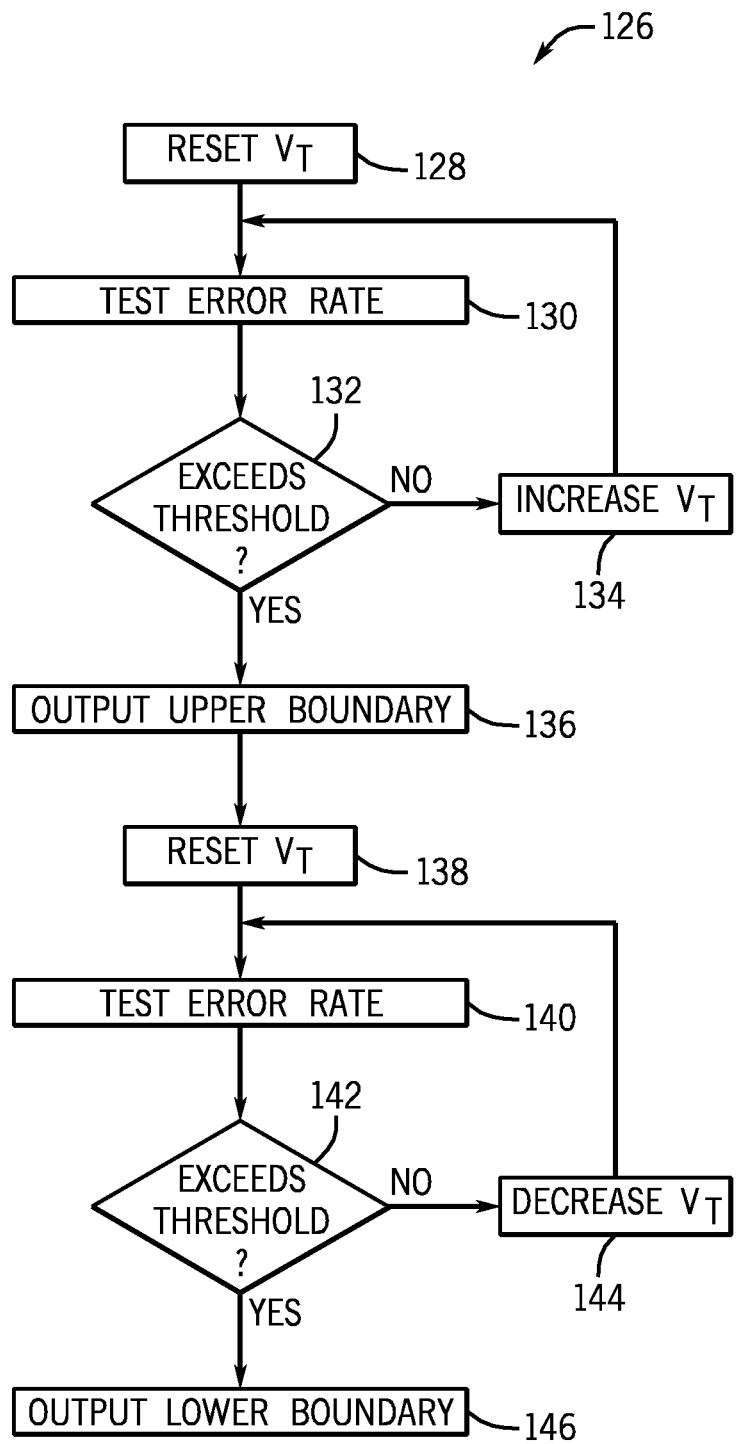

FIGS. 7 and 8 represent flowcharts that describe an embodiment of a method for determining a two-dimensional (2-D) eye diagram, such as the eye diagram 98 illustrated in FIG. 6. Generally, the flowcharts of FIGS. 7 and 8 represent algorithms that may be performed by the control logic 82 or, additionally or alternatively, by a processor on an external device that may control the control logic 82 via the EV control signals 44. Specifically, FIG. 7 is a flowchart for sweeping the eye 92 of the EQ signal 34 horizontally to determine horizontal eye boundaries, and FIG. 8 is a flowchart for sweeping the eye 92 of the EQ signal 34 vertically to determine vertical eye boundaries. To fully determine the 2-D boundaries of the eye 92, the flowcharts of FIGS. 7 and 8 may generally be used in combination. It should be understood that the horizontal and vertical sweeping described by FIGS. 7 and 8 may be performed in any order (e.g., first sweeping to the right or to the left, or first sweeping up or down) while the many coordinates of the eye 92 of the EQ signal 34 are sampled to ascertain the outer boundaries of the eye 92. Though FIGS. 7 and 8 describe an embodiment that involves determining upper and lower vertical boundaries for each horizontal selection of the eye 92, alternative embodiments may involve determining leftward and rightward boundaries for each vertical selection of the eye 92.

Turning first to FIG. 7, a flowchart represents an embodiment of a process 102 for sweeping the eye 92 of the EQ signal 34 horizontally. In a first step 104, the EV control signals 44 may cause the logic 82 to initialize the eye viewer circuitry 42. Such initialization may include, for example, causing the select signal 50 to set the multiplexers 52 and 54 such that the deserializer 56 receives the offset data signal 48 and the offset clock signal 46 so as to output the parallel data signal 58. As described above, this parallel data signal 58 may enter the error checking circuitry 60 to produce the error rate signal 62, which may be employed by the control logic 82 in determining the eye diagram 98. Further, as depicted in the embodiment shown in FIG. 4, activating the eye viewer circuitry 42 interrupts the normal data traffic (represented by recovered data signal 38 and recovered clock signal 40), as the state of the selection signal 50 during eye viewing mode causes the multiplexers 52 and 54 to pass the offset clock 46 and offset data 50 signals to the deserializer 56, rather than the recovered clock 40 and recovered data 38 signals. In another embodiment, which is described further below in FIG. 10, the IC 10 may include a redundant deserializer. Thus, in such an embodiment, even when in eye viewer mode, the offset data 48 and offset clock 46 signals may be provided to the redundant deserializer instead of deserializer 56 and, therefore, normal data traffic is not interrupted even thought the IC 10 is operating in eye viewer mode.

Steps 106-112 of the process 102 describe a manner of determining a first horizontal half of the eye diagram 98. In particular, in step 106, the control logic 82 may send a control signal 84 to the phase interpolator (PI) 86 such that no phase offset is applied to the clock signal 40. Thus, the offset clock signal 46 sent to the TVC 90 may sample data from the center of the eye 92 of the EQ signal 34. In step 108, as described in greater detail below with reference to FIG. 8, the control logic 82 may vary the threshold voltage Vt control signal 88 to determine the upper and lower vertical boundaries of the eye 92 for the current offset clock signal 46. Thus, in the first iteration of step 108, the control logic 82 may determine a first column 100 (FIG. 6) of the eye diagram along the clock center 94 of the eye 92 of the EQ signal 34. Also during step 108, the control logic 82 may output, by way of the EV output signal 64, a representation of the location of the outer vertical upper and lower boundaries as they are determined.

After the vertical boundaries of the particular horizontal slice of the eye 92 of the EQ signal 34 have been determined in step 108, a decision block 110 may assess whether a horizontal boundary has been reached, which may occur when the determined vertical boundaries are the same. If the horizontal boundary has not been reached, the process may continue to step 112. In step 112, the phase offset may be increased by a discrete amount to sample the next horizontal slice of the eye 92. In another iteration of step 108, upper and lower boundaries may be determined for the new horizontal slice of the eye 92. Steps 110, 112, and 108 may repeat until the first horizontal boundary of the eye 92 is reached. When decision block 110 determines that a horizontal boundary has been reached, as may occur when the upper and lower boundaries in a particular horizontal slice of the eye 92 are the same, the process may continue to step 114 at which the control logic 82 may or output an indication that the first horizontal boundary has been reached via the EV output signal 64.

Having obtained the first horizontal boundary, the control logic 82 may thereafter determine the second horizontal boundary, as generally described via steps 116-124. As shown in FIG. 7, steps 116-124 may respectively take place in substantially the same way as steps 106-114, with the exception that the phase offset may be decreased, rather than increased, in step 122.

FIG. 8 represents a flowchart showing a process 126 depicting an embodiment of a method for determining the upper and lower boundaries of the eye 92 of the EQ signal 34 at a given horizontal phase offset of the eye 92. As such, the process 126 of FIG. 8 may generally represent steps 108 and 118 of the process 102 of FIG. 7. In particular, steps 128-136 represent steps for determining the upper boundary, while steps 138-146 represent steps for determining the lower boundary.

At step 128, the control logic 82 may reset the threshold voltage Vt signal 88. At this point, the threshold-variable comparator (TVC) 90 may be sampling the EQ signal 34 at approximately the vertical center 96 of the eye 92. Next, at step 130, after the resulting offset data signal 48 has been deserialized in the deserializer 56 and routed through the error checking circuitry 60, the error rate signal 62 may be tested. Generally, the closer to the vertical eye center 96 and the horizontal eye center 94, the lower the error rate indicated by the error rate signal 62. As noted above, the error rate signal 62 may represent a bit error rate (BER) of the parallel data signal 58 or of a portion of the data signal 58, or may represent a cyclic redundancy check (CRC) of all or part of the parallel data 58. It should be noted, that the error rate signal 62 may be known if the data contained in the RX input signal 18 is known. However, even if the data contained in the RX input signal 18 is not known, polarity bits of data contained in the RX input signal 18 may be known. Under such conditions, the error checking circuitry 60 may specifically check for errors in the polarity bits of the output parallel data 58.

As can be appreciated, the error rate of the offset data 48 may increase as the TVC 90 progressively samples horizontal and vertical points in the eye 92 located further from the clock center 94 and the vertical eye center 96. Indeed, a point at which a threshold error rate is exceeded may mark the boundary of the eye of the recoverable EQ signal 34, beyond which the quality of the signal may drop dramatically. Such a threshold error rate may include, for example, a bit error rate (BER) of approximately $10^{-12}$, which may generally correspond to a maximum acceptable optical data error rate. However, it should be appreciated that the threshold error rate may be set to any desired rate, and may include, for example, a BER of $10^{-15}$, $10^{-12}$, $10^{-9}$, $10^{-5}$, etc. For reference, the sampling point in the eye 92 at (0, 0) may generally have a BER below approximately $10^{-12}$.

The error rate indicated by the error rate signal 62 may enter the control logic 82, which may test whether the error rate exceeds the threshold, as indicated by the decision block 132. If the error rate indicated by the error signal 62 does not exceed the threshold, the upper boundary has not been reached for the given phase offset and the process may flow to step 134. In step 134, the threshold voltage Vt may be increased by a discrete amount and the TVC 90 may begin to sample the eye 92 of the EQ signal 34 at a higher vertical location. In another iteration of step 130, the error rate of the offset data 48 may be tested again. Returning to the decision block 132, when the control logic 82 eventually determines that the error rate of the error rate signal 62 has exceeded the threshold, an upper vertical boundary has been reached, and the process may flow to step 136. In step 136, the control logic 82 may output the (x, y) coordinates of the upper boundary.

Having obtained the upper boundary of the current horizontal slice of the eye 92 of the EQ signal 34, the control logic 82 may determine the lower boundary in steps 138-146. At steps 138-146 of the process 126 may respectively be performed in substantially the same manner as steps 128-136, except that the threshold voltage Vt (represented by signal 88) may be decreased, rather than increased, at step 144.

Figure 9:
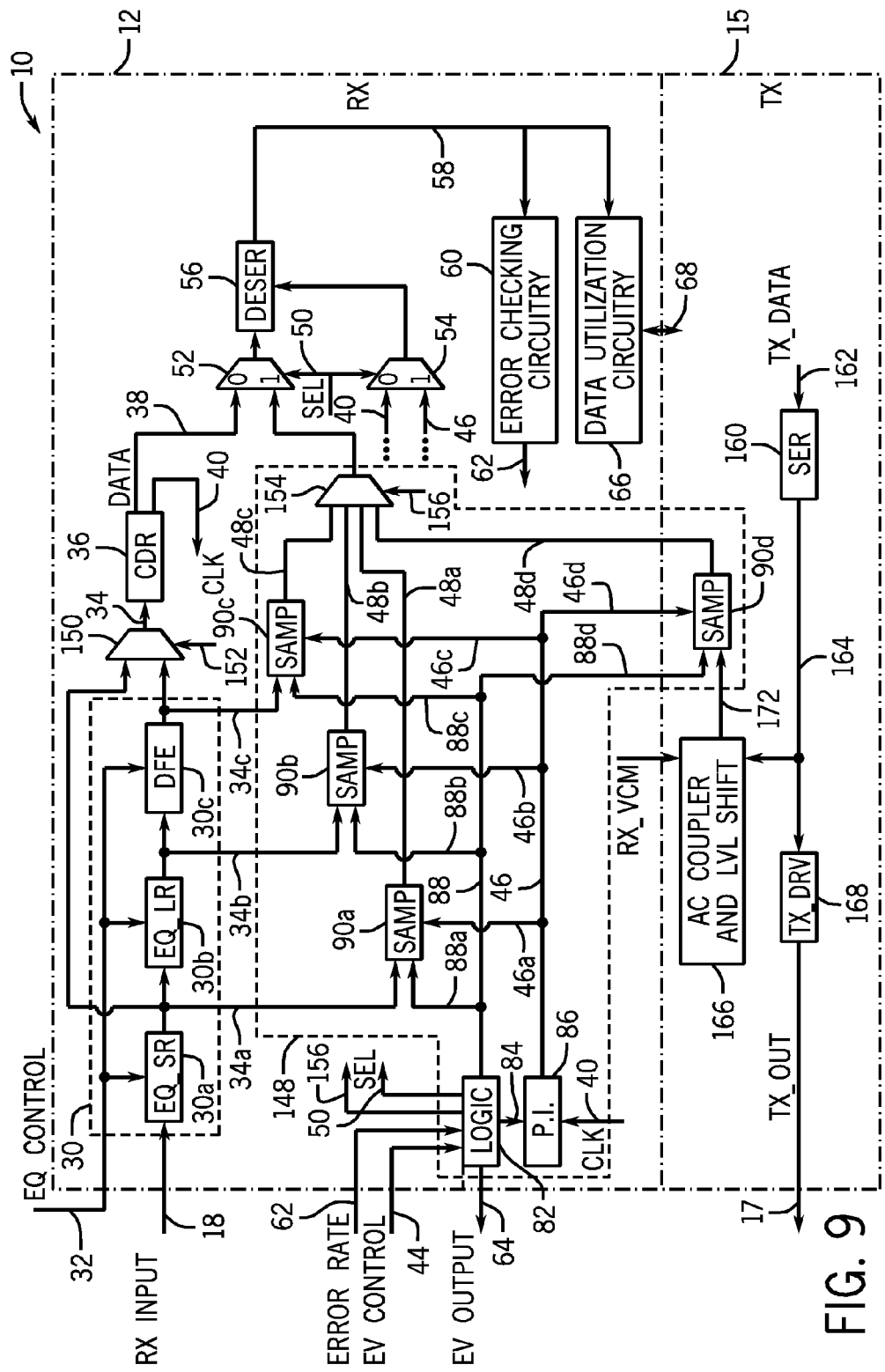
FIG. 9 is a block diagram illustrating the integrated circuit of FIG. 1 configured to provide for eye monitoring of an input signal at multiple intermediate nodes during equalization, in accordance with one embodiment.

Having described generally a process for determining an eye diagram for eye monitoring purposes, FIG. 9 illustrates another embodiment of the IC 10. Generally, the IC 10 of FIG. 9 may operate in the same manner as the embodiments shown above in FIGS. 3-4, except that the embodiment shown in FIG. 9 may provide for eye monitoring of the input signal 18 at multiple intermediate nodes within the equalizer 30, and thus is not limited to monitoring of only the equalized signal 34 after equalization, as is the case with the embodiments described above in FIGS. 3-4. This embodiment thus provides for improved flexibility for debugging and/or optimization purposes, and may be particularly well suited for high-speed serial signals, such as those having data rates of 28 Gbps or higher.

As shown in FIG. 9, the RX 12 and the TX 15 of the IC 10 are illustrated in greater detail in accordance with this embodiment. For instance, the equalizer 30 of the RX 15 is illustrated as having multiple stages, including a short-reach equalizer (EQ_SR) 30a, a long-reach equalizer (EQ_LR) 30b, and a decision feedback equalizer (DFE) 30c. The EQ_SR 30a may be configured for short signal paths, and may generally provide simpler equalization relative to the EQ_LR 30b. The EQ_LR 30b may provide more complex equalization for longer signal paths, such as those in the backplane channels of the IC 10. Collectively, the EQ_SR 30a and the EQ_RL 30b may be considered as a continuous linear equalizer. The DFE 30c may be configured to reduce errors in the input signal 18 using a decision-feedback algorithm and/or refraction. In one embodiment, the DFE 30c may be non-linear, because the input data may already sliced in the time domain.

The output 34c (from DFE 30c) of the equalizer 30 may be provided as an input to multiplexer 150. As shown, the multiplexer 150 may also receive the signal 34a, representing the partially equalized signal output from the EQ_SR 30a. Thus the output 34 of the multiplexer 150, which is controlled by selection signal 152, may be either the signal 34a or 34c. Though not shown here, in some embodiments, the signal 34b output from the EQ_LR 30b may also be provided to the multiplexer 150 as an input. Thus, the selected signal 34 may be provided from the multiplexer 150 to the clock and data recovery (CDR) circuitry 36, which may be generally identical to the CDR 36 described above with reference to FIGS. 3 and 4. Accordingly, the CDR 36 may output the recovered data signal 38 and the recovered clock signal 40.

The eye viewer circuitry 148 of FIG. 9 is also similar to the eye viewer circuitry 42 described above in FIGS. 3 and 4, except that the eye viewer circuitry 148 is configured to provide for eye monitoring of the input signal 18 at multiple nodes within the equalizer 30, as well as after equalization. Additionally, the present embodiment also provides for eye monitoring of a serial output signal 172 transmitted from the TX 15 of the IC 10. For example, as shown in FIG. 9, the eye viewer circuitry 148 includes control logic 82 and phase interpolator logic (PI) 86, both of which may be configured generally similar to their corresponding elements from the eye viewer circuitry 42 of FIG. 4. For instance, the control logic 82 here also receives EV control signal(s) 44, an error rate signal 62 (from the error-checking circuitry 60), and outputs the selection signal 50 (to multiplexers 52, 54), and control signal 84 (to PI 86). The control logic 82 in this embodiment may also output selection signal 156 (to multiplexer 154), as discussed further below. The PI 86 may receive the control signal 84 and the recovered clock 40. As discussed above, based on the control signal 84, the PI 86 may be configured to generate an offset clock signal 46 by altering the phase of the recovered clock signal 40.

Further, when compared to the eye viewer circuitry 42, the eye viewer circuitry 148 of FIG. 9 includes multiple samplers, represented here by reference numbers 90a-90d, each of which may be configured to sample a respective signal. Each of the samplers 90a-90d may be configured like the sampler 90 of FIG. 4 as a threshold voltage comparator. Thus, the embodiment shown in FIG. 9 essentially provides a separate sampler 90 for each signal of interest (e.g., signals 34a, 34b, 34c, 172), while sharing the control logic 82 and the phase interpolator (PI) 86 between the multiple samplers 90a-90d. By sharing these components, the IC 10 of FIG. 9 reduces the number of components of the IC 10, which saves circuit real estate area and reduces power consumption compared to if a separate control logic 82 and PI 86 were to be provided for each sampler 90a-90d.

A description of how eye monitoring of the multiple signals mentioned above is now provided. For example, if eye monitoring is desired on the signal 34a (after the EQ_SR 30a but before the EQ_LR 30b), then an offset clock signal 46a and a reference voltage signal 88a is provided to the sampler 90a, which receives the signal 34a. Thus, the sampler (TVC) 90a may receive and sample the signal 34a on the offset clock signal 46a and output the offset data signal 48a. For example, like the sampler 90 described above in FIG. 4, the sampler 90a may, in one embodiment, output a binary 1 if the signal 34a exceeds the reference voltage represented by signal 88 on the offset clock signal 46 and may output a binary 0 if the signal 34 is beneath the reference voltage 88a on the offset clock signal 46.

In this manner, the varying of the offset clock signal 46a to represent different phase offsets of the recovered clock 40 may cause the sampler 90a to sample different horizontal portions of the eye of the signal 34a, while the varying of the reference voltage indicated by the signal 88a may cause the sampler 90a to sample different vertical portions of the eye of the signal 34a. Thus, by varying the offset clock signal 46a via the control signal 84 and the reference voltage provided to the sampler 90a via the control signal 88a, the control logic 82 may cause the sampler 90a to output data recovered from any location within the eye of the signal 34a.

Further, when performing eye monitoring of the signal 34a, the control logic 82 also provides the selection signal 156 to the multiplexer 154, which causes the multiplexer 154 to output the offset data signal 48a from the sampler 90a to the multiplexer 52. The offset clock signal 46a provided to the sampler 90a is also provided to the multiplexer 54. Here, the control logic 82 also provides the selection signal 50, which causes the multiplexers 52 and 54 to pass the offset data signal 48a and the offset clock signal 46a, respectively, to the deserializer 56, which produces the parallel signal 58 representing data sampled from the center of the eye of the signal 34a. Using the signal 58, an error rate signal 62 may be determined by the error-checking circuitry 60, which may represent a BER and/or CRC. Using generally the same techniques described in detail above with respect to FIG. 5, the eye viewer circuitry 148 may determine the boundaries of the eye of the signal 34a based at least partially upon whether the error rate signal 62 indicates an error rate that exceeds a maximum acceptable threshold (e.g., a BER of approximately $10^{-6}$ or $10^{-12}$). From such determinations, the eye viewer circuitry 148 may output an eye viewer (EV) output signal 64, which may represent data sufficient to construct an eye diagram associated with the signal 34a, which may then be used to generate a visual eye diagram, i.e., using a display device.

As can be appreciated, eye monitoring of the signals 34b (representing the input signal 18 after equalization by the EQ_SR 30a and the EQ_LR 30b), 34c (representing the final output of the equalizer 30), and the signal 172 from the TX 15 of the IC 10 may generally occur in the same manner. For instance, if eye monitoring of the signal 34b is desired, then the control logic 82 provides reference voltage 88b and the PI 86 provides the offset clock signal 46b to the sampler 90b receiving the signal 34b. The sampler 90b generates an offset data signal 48b based on the reference voltage 88b and the offset signal 46b, which is provided to the multiplexer 154. In this case, the selection signal 156 provided by the logic 82 causes the multiplexer to select the signal 48b, which is provided to the multiplexer 52, while, at the same time, the offset clock signal 46b is provided to the multiplexer 54. Selection signal 50 causes the offset data signal 48b and the offset clock signal 46b to be passed to the deserializer 56 to produce the parallel signal 58 from which an error rate signal 62 may be determined (using error-checking circuitry 60). Like before, using the error rate signal, the boundaries of the eye of the signal 34b, and therefore an eye diagram, may be determined.

Similarly, if eye monitoring of the signal 34c is desired, then the control logic 82 provides reference voltage 88c and the PI 86 provides the offset clock signal 46c to the sampler 90c receiving the signal 34c. The sampler 90c generates an offset data signal 48c based on the reference voltage 88c and the offset signal 46c, which is provided to the multiplexer 154. Here, the selection signal 156 provided by the logic 82 causes the multiplexer to select and pass signal 48c to the multiplexer 52, while, at the same time, the offset clock signal 46c is provided to the multiplexer 54. The selection signal 50 causes the offset data signal 48c and the offset clock signal 46c to be passed to the deserializer 56 to produce the parallel signal 58 from which an error rate signal 62 may be determined (using error-checking circuitry 60). Using the error rate signal, the boundaries of the eye of the signal 34c, and therefore an eye diagram, may be determined.

Unlike the embodiment of the eye viewer circuitry 42 shown in FIGS. 3 and 4, the present embodiment also provides for eye monitoring of a serial output signal on the transmitter (TX) 15 side of the IC 10. As shown in FIG. 9, an additional sampler 90d is provided, which may receive the signal 172. The signal 172 may represent a serial output signal 164 output from a serializer 160 receiving parallel data, as represented by signal 162, after passing through the AC coupler and level shift circuitry 166. The serial signal 164 is also provided to the output driver 168, which may output the signal 17. Accordingly, if eye monitoring of the signal 172 is desired, then the control logic 82 provides reference voltage 88d and the PI 86 provides the offset clock signal 46d to the sampler 90d receiving the signal 34d. The sampler 90d generates an offset data signal 48d based on the reference voltage 88d and the offset signal 46d, which is provided to the multiplexer 154. Here, the selection signal 156 provided by the logic 82 causes the multiplexer to select and pass signal 48d to the multiplexer 52, while, at the same time, the offset clock signal 46d is provided to the multiplexer 54. The selection signal 50 causes the offset data signal 48d and the offset clock signal 46d to be passed to the deserializer 56 to produce the parallel signal 58 from which an error rate signal 62 may be determined (using error-checking circuitry 60). Using the error rate signal, the boundaries of the eye of the TX output signal 172 may be determined and an eye diagram may be generated.

Thus, the present embodiment, as shown in FIG. 9, provides the flexibility to not only perform eye monitoring on multiple intermediate nodes of the equalizer 30 receiving the RX input signal 18, but also to perform eye monitoring on the TX output signal 17. As discussed above, as data rates increase, such as to speeds of approximately 28 Gbps or greater, the signal quality within the transceiver (the RX and TX collectively) becomes more critical. By providing for the eye monitoring of intermediate nodes within the equalizer, debugging and optimization of the equalizer is improved. For example, based on the results of eye monitoring, control signals 32 provided to the equalizer 30, which may represent filter taps, coefficients, and/or other parameters, may be adjusted to open the eye 92.

As shown, the embodiment in FIG. 9 provides only a single deserializer 56 that receives the outputs of the multiplexers 52 and 54, which may be the recovered clock and data signals from the CDR circuitry 36 or the offset clock and data signals from the PI 86 and the samplers 90a-90d. However, if eye monitoring is enabled (e.g., by EV control signal 44), then normal traffic of the recovered data and clock signals (signals 38, 40) are interrupted, as the multiplexers 52 and 54 can only pass either the recovered data and clock signals from the CDR circuitry 36 or the offset data and clock signals from the eye viewer circuitry 148.

Figure 10:
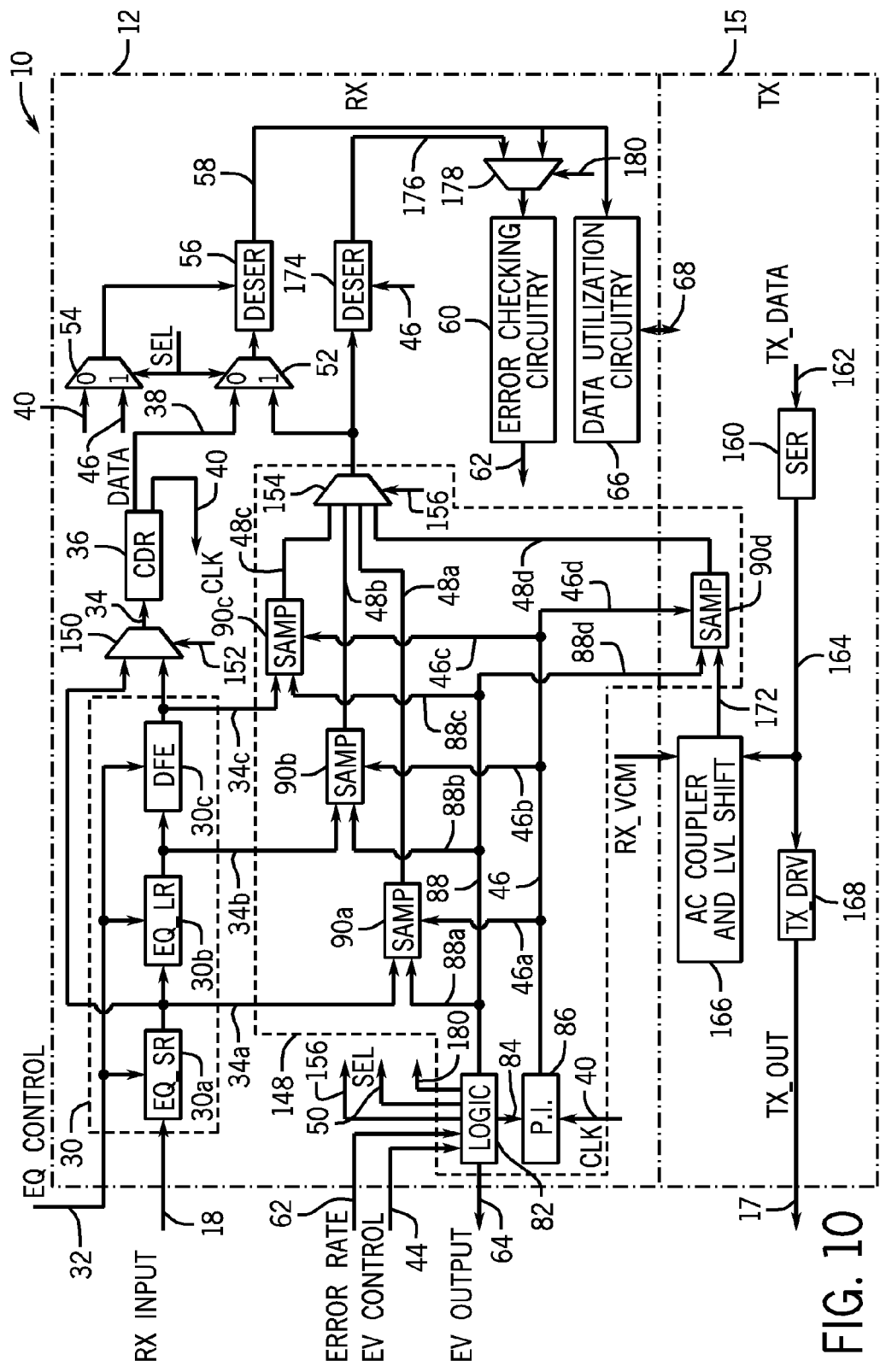
FIG. 10 is a block diagram illustrating the integrated circuit of FIG. 1 configured to provide for eye monitoring of an input signal at multiple intermediate nodes during equalization, in accordance with another embodiment.

Referring now to FIG. 10, another embodiment of the IC 10 is illustrated. The embodiment shown in FIG. 10 is, for the most part, identical to the embodiment of FIG. 9, except that a second deserializer 174 is also provided. As described below, this embodiment may allow for both the interruption of normal recovery data traffic when eye viewer mode is initiated, as well as allow for normal recovery data traffic to continue uninterrupted even when the IC 10 is operating in eye viewer mode.

For example, assuming that the interruption of normal traffic is acceptable, the eye viewer circuitry 148 of FIG. 10 operates in generally the same manner as described above with respect to FIG. 9. That is, an offset clock signal and offset data signal corresponding to a particular sampler 90a-90d is output to the multiplexers 54 and 52, respectively. In eye viewer mode, the selection signal 50 provided by the control logic 82 causes the multiplexer 52 to pass the selected offset data signal 48a-48d (from multiplexer 154) and causes the multiplexer 54 to pass the offset clock signal 46a-46d to the deserializer 56, which interrupts normal traffic of the recovery data 38. Here, the deserializer 56 outputs a parallel signal 58 based on the offset clock and data signals, which is provided to a multiplexer 178 under the control of the signal 180, also provided by the control logic 82. In this "interrupted" mode, the signal 180 controls the multiplexer to allow the signal 58 to pass to the error-checking circuitry 60 for determination of the error rate signal 62. As discussed above, this signal 62 may be used to determine the boundaries of an eye of the signal (34a-34c, 117) upon which eye monitoring is being performed.

If eye monitoring is desired without interrupting the flow of normal recovery data traffic, then the selection signal 50 controls the multiplexers 52 and 54 to pass the recovered data signal 38 from the CDR circuitry 36 and the recovered clock signal 40, respectively. The deserializer 56 thus outputs a parallel signal 58 based on the recovered data signal 38 and the recovered clock signal, which may be provided downstream to data utilization circuitry 66. For eye monitoring purposes, the deserializer 174, which may be identically configured with respect to the deserializer 56, essentially acts as a redundant deserializer for eye monitoring. For instance, as shown in FIG. 10, regardless of the state of the selection signal 50, the output of the multiplexer 154, which represents a selected offset data signal 48a-48d is provided to the redundant deserializer 174 along with its corresponding offset clock signal 46a-46d. The redundant deserializer 174 outputs a parallel signal 176, which is also provided as an input to multiplexer 178. In this "uninterrupted" mode, the control signal 180 causes the multiplexer 178 to pass the parallel signal 176 (instead of signal 58) to the error-checking checking circuitry 60 for determination of a corresponding error rate signal 62.

Essentially, this provides a separate error-checking path that is independent of the normal traffic data path. Thus, the eye viewer circuitry 148 may use the signal 62 for determining the boundaries of an eye of the signal (34a-34c, 117) upon which eye monitoring is desired, and may generate an eye diagram based on the determined boundaries. Based on the use of the redundant deserializer 174 and the multiplexer 178, eye monitoring in this embodiment may occur without interrupting normal data traffic if desired. Further, the use of a redundant deserializer 174 may also be implemented in the embodiment shown in FIGS. 3 and 4.

Figure 11:
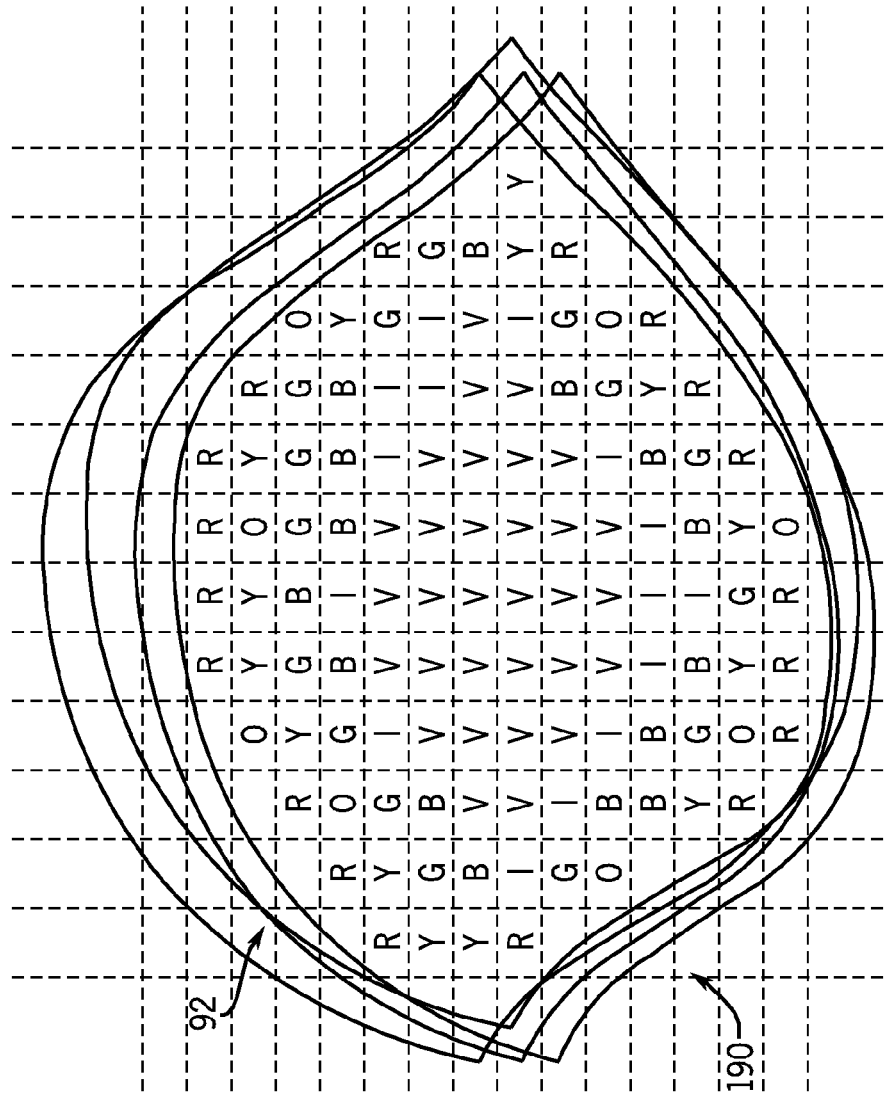
FIG. 11 is a schematic diagram of a three-dimensional (3-D) eye diagram that may be determined from the circuitry of FIG. 4 or of FIG. 9 or 10, in accordance with an embodiment.

As described in the flowcharts of FIG. 7 and FIG. 8, the control logic 82 may output via the EV output signal 64 (x, y) coordinates describing outer boundaries of the eye 92, which may be used to construct the eye diagram 98. Additional data may also be provided that may be used by an external device to construct a three-dimensional (3-D) eye diagram 190, an example of which is illustrated in FIG. 11. In particular, the eye diagram 190 of FIG. 9 includes the (x, y) shape of the eye 92 of a signal (e.g., 34a-34c or 172), as well as a (z) coordinate representing the tested error rate for each (x, y) coordinate. In the embodiment of the eye diagram 190 shown in FIG. 11, the error rate, or (z) coordinates, may be approximated using certain colors. For example, on a scale that includes red (R), orange (O), yellow (Y), green (G), blue (B), indigo (I), and violet (V), each of the colors may represent a range of bit error rates (BER) or cyclic redundancy check (CRC) error rates. By way of example, V may represent a BER of approximately $10^{-20}$ and R may represent a BER approaching $10^{-12}$, with the other colors representing intermediate BER values. Based on the 3-D eye diagram 190, an integrated circuit designer or field engineer may adjust the settings of the equalizer (EQ) 30 not only to open the eye 92, but also to lower the error rate throughout the eye 92.

To obtain the eye diagram 190 using the eye viewer circuitry 148 (or circuitry 42), the flowchart 126 of FIG. 8 may be modified slightly. For example, in steps 130 and 140, when the error rate signal 62 is received by the control logic 82, the EV output signal 64 may indicate the current coordinates (x, y, z), where x represents the current phase offset, y represents the current threshold (reference) voltage Vt, and z represents the current error rate indicated by the error rate signal 62. Additionally or alternatively, the control logic 82 may not supply the error rate via the EV output signal 64, but may simply supply the current (x, y) coordinates as each location in the eye 92 is tested. Under such conditions, another output signal of the IC 10 may provide the error rate. In either case, an external device may use such data to construct the 3-D eye diagram 190.

Figure 12:
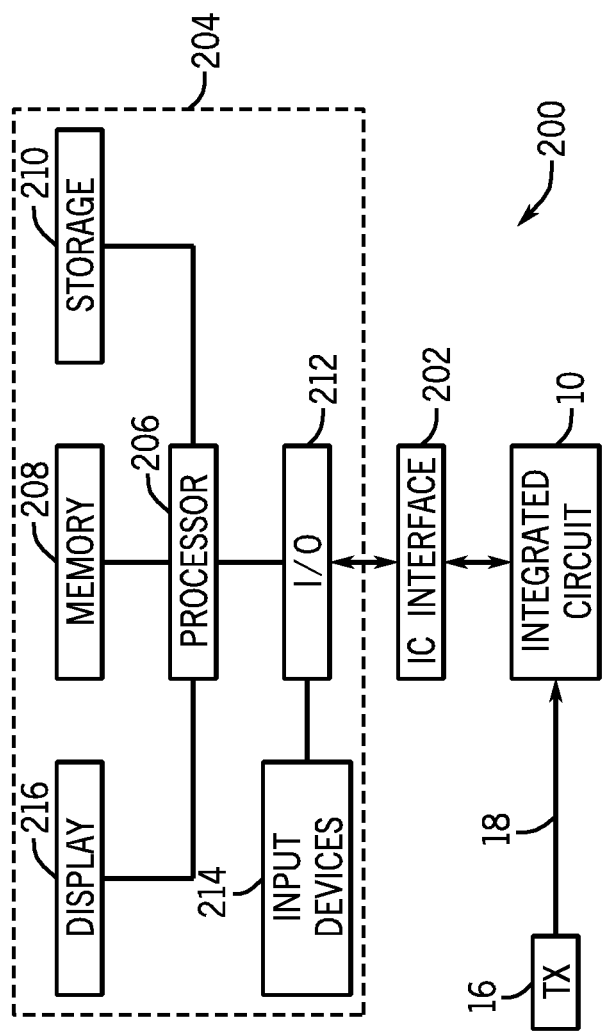
FIG. 12 is a block diagram of a system for constructing and displaying the eye diagrams of FIGS. 6 and/or 11, in accordance with an embodiment.

FIG. 12 represents illustrates a system 200 for displaying a two-dimensional (2-D) or three-dimensional (3-D) eye diagram, such as the eye diagram 98 of FIG. 6 or 190 of FIG. 11. The system 200 may also be used to tune the equalizer (EQ) 30 using EQ control signals 32 to "open" the eye 92 of the EQ signals 34. As illustrated in FIG. 10, the system 200 includes the integrated circuit (IC) 10, which receive the receiver (RX) input signal 18 from the external transmitter (TX) 16. An IC interface 202 may enable communication between the IC 10 and a data processing system 204. Such an IC interface 202 may include, for example, programmable logic device (PLD) logic within field programmable gate array (FPGA) circuitry. The IC interface 202 may operate in conjunction with FPGA software, such as Quartus® by Altera Corporation, which may enable programming of functionality into the IC 10. Additionally or alternatively, the data may be sent out via normal I/O pins of the IC 10. The receiving party may include, for example, the data processing system 204 or test equipment, such as an oscilloscope. Such data processing system 204 or test equipment may generally process and construct an eye diagram in software or hardware using the techniques described below.

The data processing system 204 may include, among other things, a processor 206 coupled to memory 208, a storage device 210, input/output (I/O) resources 212 (which may communicably couple the processor 206 to various input devices 214), and a display 216. The memory 208 and/or storage 210 may store one or more algorithms for constructing an eye diagram, such as the eye diagram 98 of FIG. 6 or 190 of FIG. 9, based on the EV output signals 64 received from the integrated circuit 10 via the IC interface 202. Such algorithms may include those described below with reference to FIGS. 13 and 14. The data processing system 204 may use these algorithms to construct an eye diagram for display on the display 216.

While observing the eye diagram on the display 166, a designer or field engineer may adjust the equalization provided by the EQ 30 using EQ control signals 32. Since the eye diagram displayed on the display 216 may represents the EQ signal 34 (or an intermediate signal 34a, 34b, or, in some cases, a serial signal from the TX 15 of the IC 10), changes in the EQ control signals 32 may be reflected in the eye diagram. In this manner, a designer or field engineer may view the actual effect, and not merely a simulation, of adjustments to the EQ 30. Thus, a designer or field engineer may adjust the EQ 30 to "open" the eye 92 of the EQ signal 34, as well as to reduce the error rate distributed across the eye 92. The constructed eye diagram may also be used for diagnostic or debug purposes only, without adjusting the EQ 30, in the field.

Figure 13:
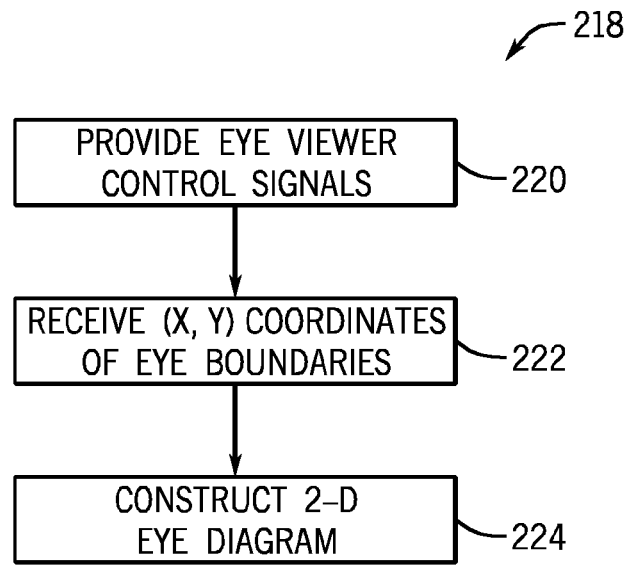
FIG. 13 is a flowchart describing an embodiment of a method for constructing a two-dimensional (2-D) eye diagram using the system of FIG. 12.
Figure 14:
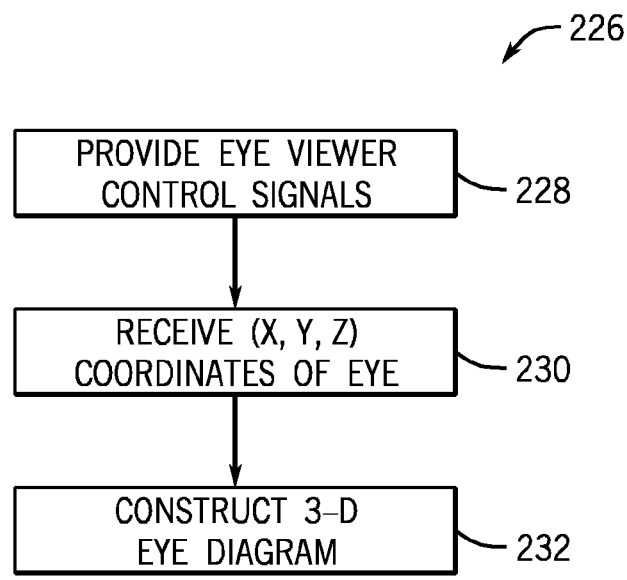
FIG. 14 is a flowchart describing an embodiment of a method for constructing a three-dimensional (3-D) eye diagram using the system of FIG. 12.

FIGS. 13 and 14 represent flowcharts describing embodiment of methods for constructing a two-dimensional (2-D) eye diagram, such as the eye diagrams 98 of FIG. 6, or a three-dimensional (3-D) eye diagram, such as the eye diagram 190 of FIG. 9, respectively. Turning first to FIG. 13, a flowchart 218 describes an embodiment of a method for constructing a 2-D eye diagram from EV output signals 64 output by the control logic 82 of the eye viewer circuitry 42 or 148. In a first step 220, the integrated circuit (IC) 10 may output EV output signals 64, which may include the (x, y) coordinates of outer boundaries of the eye 92 of the signal being monitored (e.g., 34a, 34b, 34c, 172). In step 222, the data processing circuitry 204 may receive such (x, y) coordinates. In step 224, the data processing circuitry 204 may use the (x, y) coordinates of the eye 92 boundaries to construct a 2-D eye diagram in the manner of the eye diagram 98 of FIG. 6, which may be displayed on the display 216. If desired, one or more smoothing algorithms may be applied to interpolate the edges of the resulting eye diagram.

A flowchart 226 of FIG. 14 describes an embodiment of a method for constructing a three-dimensional (3-D) eye diagram, such as the eye diagram 190 of FIG. 11. Like the flowchart 218 of FIG. 13, in a first step 228, the integrated circuit (IC) 10 may output EV output signals 64, which may include the (x, y) coordinates of each sampled location of the eye 92 of the signal being monitored (e.g., 34a, 34b, 34c, 172) and the corresponding error rate indicated by the error rate signal 62. Additionally or alternatively, the error rate may be transmitted from the IC 10 via one or more signals other than the EV output signals 64. In step 230, the data processing circuitry 204 may receive such (x, y) coordinates and the corresponding error rates. In step 232, the data processing circuitry 204 may use the (x, y) coordinates of the eye 92 boundaries to construct a general 2-D shape of the eye diagram, over which the error rates may be laid to produce a 3-D eye diagram. In some embodiments, the error rates may represent a distance in the z-direction, while in other embodiments, ranges of error rates may be assigned certain colors and overlaid across the eye diagram, such as represented by the eye diagram 190 of FIG. 11. Some embodiments may represent the error rates as both distances in the z-direction and as overlaid colors. If desired, one or more smoothing algorithms may be applied to smooth the edges and error rates of the resulting eye diagram.

While the invention may be susceptible to various modifications and alternative forms, specific embodiments have been shown by way of example in the drawings and have been described in detail herein. Therefore, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of manufacturing an integrated circuit (IC) device comprising:
   providing an equalizer of the IC device, wherein the equalizer comprises a plurality of internal nodes, each of the internal nodes being at an output of a respective stage of equalization in the equalizer, wherein each of the internal nodes is selectable for analysis of a serial input signal propagated through the equalizer; and
   providing eye viewer circuitry of the IC device to analyze a serial signal from a selected internal node to determine coordinates useful for generating a corresponding eye diagram of the serial signal.

2. The method of claim 1, comprising configuring the eye viewer circuitry to determine horizontal and vertical boundaries of the eye diagram by sampling the serial signal at variable phase offsets from a clock signal associated with the serial input signal and at variable reference voltages, and testing error rates associated with the sampled signal.

3. The method of claim 2, comprising configuring the eye viewer circuitry to test the error rates associated with the sampled signal by determining at least one of a bit error rate (BER) or a cyclic redundancy check (CRC) error rate, or a combination thereof.

4. The method of claim 2, comprising configuring the eye viewer circuitry to: determine the variable phase offsets by providing a first control signal indicating a phase offset from control logic of the eye viewer circuitry to a phase interpolator, and to determine the variable reference voltages by providing a second control signal indicating a reference voltage from the control logic to a sampler configured to sample the serial signal.

5. The method of claim 4, comprising configuring the phase interpolator to receive the clock signal associated with the serial input signal and provide an offset clock signal to the sampler based at least partially upon the first control signal.

6. The method of claim 1, comprising providing control logic to enable the selection of one of the internal nodes for analysis by enabling a selection signal provided to a multiplexer to cause the multiplexer to output a sampled signal corresponding to the serial signal at the selected internal node being analyzed by the eye viewer circuitry signal.

7. The method of claim 1, comprising enabling the serial input signal to operate at approximately 28 Gbps or higher.

8. An integrated circuit (IC) device comprising:
   a receiver;
   an equalizer configured to equalize a serial input signal received by the receiver, wherein the equalizer comprises a plurality of equalizer stages, wherein the output of each equalizer stage comprises an internal node of the equalizer, and the equalizer is configured such that each of the internal nodes is selectable for analysis of a serial signal at the internal node;
   a clock and data recovery circuit configured to receive an output of the equalizer and output a recovered data signal and a recovered clock signal;
   eye viewer circuitry configured to select one of the internal nodes of the equalizer for analysis of a serial signal at the selected internal node and to determine an eye diagram corresponding to the serial signal from the selected internal node; and a deserializer configured to output a first parallel signal based upon the recovered data signal and the recovered clock signal from the clock and data recovery circuit when the IC device is operating in a normal traffic mode and to output a second parallel signal based upon a selected offset data signal and an offset clock signal from the eye viewer circuitry when the IC device is operating in an eye viewer mode, wherein the selected offset data signal is determined by sampling the serial signal from the selected internal node.

9. The IC device of claim 8, wherein the eye viewer circuitry comprises:

a plurality of samplers, wherein each sampler is configured to receive a serial signal from a respective one of the internal nodes, a reference voltage, and the offset clock signal, and to output an offset data signal based at least partially upon the received serial signal, the reference voltage, and the offset clock signal;

control logic configured to provide a reference voltage to each of the samplers and a first control signal indicative of a phase offset;

a phase interpolator configured to receive the recovered clock signal and to output the offset clock signal based at least partially upon the first control signal to each of the samplers;

error checking circuitry configured to detect an error rate of data contained in the selected offset data signal to produce an error rate signal; and a selection circuit configured to receive the respective offset data signal from each of the samplers and to output one of the offset data signals as the selected offset data signal in response to a first selection signal provided by the control logic.

10. The IC device of claim 9, wherein the control logic is configured to receive the error rate signal, vary the first control signal to vary the phase offset, and vary the reference voltage to determine the eye diagram associated with the serial signal from the selected internal node based at least partially upon the error rate indicated by the error rate signal.

11. The IC device of claim 8, wherein the equalizer comprises a short-reach equalizer stage, a long-reach equalizer stage, and a decision feedback equalizer stage, and wherein the internal nodes comprise a first internal node representative of the output of the short-reach equalizer stage, a second internal node representative of the output of the long-reach equalizer, and a third internal node representative of the output of the decision feedback equalizer.

12. The IC device of claim 9, wherein the control logic and the phase interpolator of the eye viewer circuitry are shared between each of the samplers.

13. The IC device of claim 9, comprising a sampler configured to receive a serial output signal from an internal node of a transmitter of the IC device, and wherein the eye viewer circuitry is configured to analyze the serial output signal and to determine an eye diagram corresponding to the serial output signal if the internal node of the transmitter is selected.

14. The IC device of claim 8, comprising:

a first multiplexer configured to receive the recovered data signal from the clock and data recovery circuit as a first input and the selected offset data signal from the eye viewer circuitry as a second input; and a second multiplexer configured to receive the recovered clock signal from the clock and data recovery circuit as a first input and the offset clock signal from the eye viewer circuitry as a second input;

wherein the first and second multiplexers are responsive to a common control signal, and wherein the first and second multiplexers are configured to select the recovered data signal and recovered clock signal, respectively, if the common control signal indicates a first binary value, and to select the offset data signal and offset clock signal, respectively, if the common control signal indicates a second binary value.

15. The IC device of claim 9, wherein the control logic is configured to determine horizontal boundaries of the eye diagram by increasing or decreasing the phase offset indicated by the first control signal until the error rate exceeds a threshold, and to determine the vertical boundaries of the eye diagram by increasing or decreasing the reference voltage until the error rate exceeds the threshold.

16. The IC device of claim 9, wherein each of the samplers comprises a threshold voltage comparator configured to output a first binary value if its respective serial signal exceeds the reference voltage and a second binary value if its respective serial signal is less than the reference voltage.

17. The IC device of claim 9, wherein the reference voltage is determined using a digital to analog converter (DAC).

18. The IC device of claim 8, wherein the serial input signal has a data rate of at least 28 Gbps.

19. An integrated circuit (IC) device comprising:

a receiver comprising an equalizer configured to equalize a received serial input signal;

a clock and data recovery (CDR) circuit configured to receive the equalized serial input signal and to output a recovered data signal and a recovered clock signal;

eye viewer circuitry configured to receive a serial signal from the IC device for analysis, to output an offset data signal and an offset clock signal, and to determine an eye diagram of the serial signal when the IC device is operating in an eye viewer mode;

a first deserializer configured output a first parallel signal based upon the recovered data signal and the recovered clock signal from the CDR circuit when the IC device is operating in either of a normal mode or an uninterrupted eye viewer mode, and to output the first parallel signal based upon the offset data signal and the offset clock signal from the eye viewer circuitry if the IC device is operating in an interrupted eye viewer mode, wherein the second parallel signal is provided to an error checking circuitry for determination of an error rate signal; and a second deserializer configured to output a second parallel signal based upon the offset data signal and the offset clock signal when the IC is operating in the uninterrupted eye viewer mode, wherein the third parallel signal is provided to the error checking circuit for determination of the error rate signal.

20. The IC device of claim 19, comprising:

a first multiplexer configured to receive the recovered data signal from the CDR circuit as a first input and the offset data signal from the eye viewer circuitry as a second input; and a second multiplexer configured to receive the recovered clock signal from the CDR circuit as a first input and the offset clock signal from the eye viewer circuitry as a second input;

wherein, when the IC device is operating in either the normal mode or the uninterrupted eye viewer mode, the first and second multiplexers are configured to pass the recovered data signal and the recovered clock signal, respectively, and wherein, when the IC device is operating in the interrupted eye viewer mode, the first and second multiplexers are configured to pass the offset data signal and the offset clock signal, respectively.

21. The IC device of claim 20, comprising:
a third multiplexer configured to receive the first parallel signal from the first deserializer as a first input and the second parallel signal from the second deserializer as a second input, wherein the third multiplexer is configured to pass the first parallel signal to the error checking circuitry if the IC device is operating in either of the normal mode or the interrupted eye viewer mode and to pass the second parallel signal to the error checking circuitry if the IC device is operating in the uninterrupted eye viewer mode.

22. The IC device of claim 19, wherein the uninterrupted eye viewer mode allows for the determination of the eye diagram corresponding to the serial signal received by the eye viewer circuitry without interrupting normal traffic comprising the recovered data signal through the IC device.

23. The IC device of claim 19, wherein the eye viewer circuitry is configured to select the received serial signal from a plurality of serial signals comprising the output of the equalizer, a serial signal from an internal node within the equalizer, or a serial signal from a transmitter of the IC device.

24. The IC device of claim 19, wherein the IC device comprises a field-programmable gate array.

25. A method comprising:
receiving a serial input signal at a receiver of an integrated circuit (IC) device;
equalizing the serial input signal using a equalizer comprising a plurality of equalizer stages to produce an equalized signal;
selecting a serial signal from the output of one of equalizer stages for analysis;
sampling the selected serial signal at variable phase offsets from a clock signal associated with the equalized signal and at variable threshold voltages using a sampler associated with the selected serial signal;
detecting an error rate in the sampled signal using error checking circuitry;
determining an error rate signal based on the detected error rate; and
determining one or more coordinates useful for generating an eye diagram of the selected serial signal based at least in part on the error rate signal using circuitry configured to vary the phase offsets and the threshold voltages.

26. The method of claim 25, comprising using clock and data recovery circuitry to recover the clock signal associated with the equalized signal.

27. The method of claim 25, comprising, in response to the eye diagram, receiving a request to modify one or more parameters of the equalizer to cause the eye diagram to become more open and modifying the one or more parameters.

28. The method of claim 25, wherein the varying of the phase offsets determines the horizontal boundaries of the eye diagram and wherein the varying of the threshold voltages determines the vertical boundaries of the eye diagram.

29. The method of claim 25, wherein selecting the serial signal comprises, selecting the serial signal from the output of one of the equalizer stages or, additionally, from a serial signal transmitted by a transmitter of the IC device.

* * * * *